United States Patent
Kikuchi et al.

(10) Patent No.: US 6,301,686 B1
(45) Date of Patent: Oct. 9, 2001

(54) GRAPHIC LAYOUT COMPACTION SYSTEM CAPABLE OF COMPACTING A LAYOUT AT ONCE

(75) Inventors: Hideo Kikuchi; Yutaka Akimoto; Toshiyuki Kaneko, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/274,475

(22) Filed: Mar. 23, 1999

(30) Foreign Application Priority Data

Mar. 24, 1998 (JP) .................................................. 10-075942

(51) Int. Cl.[7] .................................................. G06F 19/00
(52) U.S. Cl. .................................................. 716/2
(58) Field of Search .................................. 716/2, 12, 19; 375/500.02

(56) References Cited

U.S. PATENT DOCUMENTS

5,987,086 * 11/1999 Raman et al. .................. 375/500.02

FOREIGN PATENT DOCUMENTS

| 63-181349 | 7/1988 | (JP) . |
| 1-279373 | 11/1989 | (JP) . |
| 5-274392 | 10/1993 | (JP) . |
| 6-268062 | 9/1994 | (JP) . |
| 9-204461 | 8/1997 | (JP) . |

OTHER PUBLICATIONS

W. Yamamoto et al., "A Chip Compaction Method on Constraint Graph and the Experimental Result", Technical Report of IEICE, VDL91–43, 1991, pp. 41–48.

W. Yamamoto et al., "A Chip Spacing Method for layouts with Design–Rule Violations", Technical Report of IEICE, VDL91–120, Feb. 7, 1991, pp. 37–44.

W. Yamamoto et al., "A Chip Spacer with Automatic 45° Diagonal Wiring Generation", Technical Report of IEICE, VDL91–123, 1992, pp. 17–24.

K. Sakanushi et al., "Concurrent Represenatation and Optimization of Placement and Route on BSG", Technical Report of IEICE, VLD97–40, Jun. 1991, pp. 175–182.

* cited by examiner

Primary Examiner—David Nelms
Assistant Examiner—Thong Le
(74) Attorney, Agent, or Firm—Sughrue, Mion, Zinn, Macpeak & Seas, PLLC

(57) ABSTRACT

In a graphic layout compaction system for compacting a layout where components and routes are placed on a two-dimensional space, a terminal graph generator prepares terminal graph data indicative of terminal graphs having component terminals as nodes. The terminal graph generator calculates, as a movement amount for allowing a first component terminal to come near a second component terminal, a movement limit area within which the first component terminal can move in any directions towards the second component terminal in consideration of a route bandwidth interposed therebetween. A component compactor moves the first component terminal on a position where the first component terminal is not interfered with the movement limit area. A rerouting unit shapes routes into shaped routes having configurations including oblique parts to reroute the shaped routes in a space between the first and the second component terminals.

68 Claims, 29 Drawing Sheets

FIG.7A SEGMENT DATUM(TERMINAL & VIA HOLE)
- 31 SEGMENT NUMBER
- 32 COMPONENT NUMBER
- 36 CONFIGURATION NUMBER
- 33 POSITION NUMBER

FIG.7B SEGMENT DATUM(ROUTE & POLYGONAL CONDUCTOR CONFIGURATION)
- 31 SEGMENT NUMBER
- 36 CONFIGURATION NUMBER
- 33 POSITION NUMBER (1ST END)
- 33 POSITION NUMBER (2ND END)
  INDICATION OF FIXED OR DEFORMABLE CONFIGURATION

FIG.7C 34 POSITION DATUM
- 33 POSITION NUMBER
  X COORDINATE VALUE
  Y COORDINATE VALUE
  LAYER PLANE NUMBER
- 32 COMPONENT NUMBER

FIG.7D 35 CONFIGURATION DATUM
- 36 CONFIGURATION NUMBER
  PATTERN WIDTH IN LONGITUDINAL DIRECTION
  PATTERN WIDTH IN LATERAL DIRECTION
  WIDTH IN 1ST DIAGONAL DIRECTION
  WIDTH IN 2ND DIAGONAL DIRECTION

FIG.7E ROUTING LIMIT POSITION DATUM
- 31 SEGMENT NUMBER OF ROUTE
- 31 SEGMENT NUMBER OF COMPONENT TERMINAL
- 81 DIRECTION TURNING FROM ROUTE TO COMPONENT TERMINAL
- 36 CONFIGURATION NUMBER OF ROUTING RESTRAINT AREA
- 33 POSITION NUMBER OF COMPONENT TERMINAL

CONSTRAINT GRAPH DATUM

FIG.7F

61 DIRECTION OF CONSTRAINT GRAPH
31 SEGMENT NUMBER OF 1ST NODE IN GRAPH
31 SEGMENT NUMBER OF 2ND NODE IN GRAPH

TERMINAL GRAPH DATUM

FIG.7G

61 INTERFERENCE DIRECTION
31 COMPONENT TERMINAL SEGMENT NUMBER OF 1ST NODE IN GRAPH
31 COMPONENT TERMINALSEGMENT NUMBER OF 2ND NODE IN GRAPH
36 CONFIGURATION NUMBER OF RELATIVE LIMIT MOVEMENT AMOUNT OCTAGON
74 RELATIVE MOVEMENT LIMIT DISTANCE
   ROUTE BANDWIDTH
   ROUTE NUMBERS BETWEN GRAPH n
31 SEGMENT NUMBER OF 1ST ROUTE
31 SEGMENT NUMBER OF 2ND ROUTE
   :
31 SEGMENT NUMBER OF n-TH ROUTE

75 TERMINAL CONSTRAINT ARRAY

FIG.7H

32 COMPONENT NUMBER
61 INTERFERENCE DIRECTION
74 RELATIVE MOVEMENT LIMIT DISTANCE
79 TERMINAL GRAPH NUMBER
78 PROCESSING FLAG

55 SHORTEST ROUTE NETWORK GRAPH DATUM

61 INTERFERENCE DIRECTION

32 COMPONENT NUMBER OF 1ST NODE IN GRAPH

32 COMPONENT NUMBER OF 2ND NODE IN GRAPH

74 RELATIVE MOVEMENT LIMIT DISTANCE

79 TERMINAL GRAPH NUMBER

FIG.17

GRAPHIC LAYOUT COMPACTION SYSTEM CAPABLE OF COMPACTING A LAYOUT AT ONCE

BACKGROUND OF THE INVENTION

This invention relates to a graphic layout compaction system and a graphic layout compaction method.

An automatic layout system is utilized for designing a layout of a large-scale semiconductor integrated circuit or a layout of a printed-circuit board. The large-scale semiconductor integrated circuit comprises a lot of semiconductor cells while the printed-circuit board mounts a lot of parts thereon. The semiconductor cells may be merely referred to cells. The semiconductor cells and the parts are collectively called components in the present specification. Although each component has at least one terminal (which is called a component terminal), the component terminal may be called the component. In addition, in the automatic layout system of the type, various compaction techniques for moving components with the components linked are already proposed.

By way of example, a conventional graphic compaction system is described in Japanese Unexamined Patent Publication of Tokkai No. Hei 9-204,461 or JP-A 9-204,461 (which will be herein called a first prior art) which is published on Aug. 5, 1997 and which has a title of invention as "COMPACTION DEVICE." The graphic compaction system according to JP-A 9-204,461 compacts components with relative position relationship of the components held. However, this graphic compaction system is disadvantageous in that it is impossible to compact a pattern having routes or wires between component terminals. This is because this graphic compaction system places or arranges only the parts (the components) on a printed-circuit board in a stage prior to routing or wiring between terminals (the component terminals) of the parts and then compacts its placement or arrangement.

In the manner as described above, a technique using a constraint graph is frequently utilized in a conventional compaction processing for compacting the routes or wires together with semiconductor cells or parts (the components). As a compaction technique using the constraint graph, a jog insertion compaction technique is proposed which modifies structure of the constraints graph by inserting a bent part called "jog" in the routing or wiring thereby enable to reduce an area of the layout and to correct places with design-rule violations (see reference (1): Wataru Yamamoto, Toru Awashima, Masao Sato, and Tatsuo Ohtsuki, "A Chip Compaction Method on Constraint Graph and the Experimental Result", TECHNICAL REPORT OF IEICE, VLD91-93, pp. 41-48, 1991, reference (2): Wataru Yamamoto, Toru Awashima, Masao Sato, and Tatsuo Ohtsuki, "A Chip Spacing Method for Layouts with Design-Rule Violations", TECHNICAL REPORT OF IEICE, VLD91-120, pp. 37–44, Feb. 7, 1991, and reference (3): Wataru Yamamoto, Toru Awashima, Masao Sato, and Tatsuo Ohtsuki, "A Chip Spacer with Automatic 45° Diagonal Wiring Generation", TECHNICAL REPORT OF IEICE, VLD91-123, pp. 17–24, 1992).

In the manner which will later be described in conjunction with FIG. 1, a conventional layout compaction device comprises a cell placement processing unit (cell arrangement processing unit), an inter-cell routing processing unit (inter-cell wiring processing unit), a longest rout searching unit, a layout enlarging unit, a layout correction designating unit, a layout automatic compressing unit (compaction unit), a layout data memory, and a layout result display unit.

The conventional layout compaction device having such structure operates in the manner which will presently be described.

The cell placement processing unit carries out processing of placement or arrangement for cells in the manner as is well known in the art and stores cell layout data indicative of a layout of the cells in the layout data memory. The inter-cell routing processing unit carries out processing of routing or wiring between the cells in the manner as is well known in the art and stores routing layout data (wiring layout data) indicative of a layout of the routing or the wiring in the layout data memory. The longest route searching unit searches a series of graphic elements having the longest route in the layout stored in the layout data memory in order to compact a layout of each cell and the routing or wiring on an LSI chip into a smaller area and displays it in the layout result display section. The layout enlarging unit inserts a space crossing the longest route of its constraint graph in the layout in the manner which will later be described. The layout correction designating unit responds to a commend from an operator and moves a part from the longest route of the constraint graph so as to shorten the longest route in the manner which will later be described. In addition, the compaction unit (the automatic layout compressing unit) compacts the layout indicative of a corrected result in the manner which will later be described.

However, in a case of carrying out compaction of the layout so as to reduce the layout in both longitudinal and lateral directions, the conventional compaction unit reduces the layout in two steps so as to first reduce it in one direction (e.g. the longitudinal direction) and to subsequently reduce it in another direction (e.g. the lateral direction). Therefore, when the layout is first reduced in the longitudinal direction, the parts or the components crowd in the longitudinal direction and it results in preventing reduction of placement or arrangement on subsequently reducing placement or arrangement of the parts or the components and the layout of the routing or the wiring in the lateral direction.

In addition, those skilled in the art may hit upon a method comprising the steps of extending the Dijkatra method, of simultaneously evaluating a movable distance of the longitudinal direction and another movable distance of the lateral direction for each part or component, and of moving the parts or the components in order ascending the movable distances in its direction to place or arrange the parts or the components. However, this method is disadvantageous in that placement or arrangement of the parts or the components crowed in a particular direction selected from the longitudinal direction and the lateral direction prevents the parts or the components from subsequently moving in a direction perpendicular to the particular direction.

The reason for this defect is as follows. This conventional compaction system carries out compaction of the layout so as to first move all of the parts or the components in the longitudinal direction with all of the parts or the components pushed to touch a substrate end and to subsequently move all of the parts or the components in the lateral direction with all of the parts or the components pushed to touch the substrate end. Therefore, an initial result of placement or arrangement for semiconductor cells or parts is not reflected to the layout after compaction and compaction in an initial direction results in unbalancing placement or arrangement of the parts or the components. As a result, compaction of the semiconductor cells and the parts in the next direction is prevented.

In addition, to improve this defect, still another conventional graphic compaction system is described in Japanese Unexamined Patent Publication of Tokkai No. Sho 63-181, 349 or JP-A 63-181,349 (which will be herein called a third prior art) which is published on Jul. 26, 1988 and which has a title of invention of "LAYOUT DESIGN EQUIPMENT FOR LSI." The graphic compaction system according to JP-A 63-181,349 moves semiconductor cells in a symmetrical direction towards a center of the layout for a chip before routing or wiring process for an LSI, compacts the layout so that the semiconductor cells collect in a center direction of the chip, and makes routing or wiring between the semiconductor cells.

However, the third prior art has a defect as follows. That is, the third prior art divides an area of the layout about the center of the chip into four divided areas and carries out compaction in the respective divided areas. In addition, in each divided area, the third prior art first carries out primary compaction of the semiconductor cells in a first direction and subsequently carries out secondary compaction of the semiconductor cells in a second direction perpendicular to the first direction. As a result, a result of the primary compaction may prevent the semiconductor cells from moving in the second direction in the secondary compaction.

The reason for this defect is as follows. That is, the conventional compaction system carries out compaction of the layout so as to move the layout in a predetermined designated direction in spite of moving the semiconductor cells (the parts) either in the longitudinal direction or in the lateral direction. As a result, when a difficulty occurs in the designated direction for moving the parts or the components, movement of the parts or the components is prevented.

In addition, to improve this defect, yet another conventional graphic compaction system is described in Japanese Unexamined Patent Publication of Tokkai No. Bei 5-274, 392 or JP-A 5-274,392 (which will be herein called a fourth prior art) which is published on Oct. 22, 1993 and which has a title of invention of "LAYOUT COMPACTION SYSTEM." The graphic compaction system according to JP-A 5-274,392 comprises a pattern division section for dividing a substrate into a plurality of partial areas each having routing or wiring as a boundary and a plurality of partial pattern compression sections for the respective partial areas. The partial pattern compression sections compress the shape of the partial areas in the substrate to the left or right from a left-hand end of the substrate and compress the shape of the partial areas in the substrate to up and down from an upper end of the substrate. Therefore, the graphic compaction system according to JP-A 5-274,392 uniformly compacts the entire area of the substrate with relationship up and down and left and right in the area maintained.

However, the fourth prior art has a defect as follows. That is, although the fourth prior art can compress the partial areas of the substrate by using partial compaction, it is impossible to deal with oblique routing or wiring. This is because the fourth prior art carries out expansion and contraction of the partial areas by expanding and contracting the routing or the wiring in the longitudinal and lateral directions on the premise that the routing or wiring is crosswise routing or wiring.

In addition, a method based on the Bounded Sliceline-Grid (BSG) is proposed which comprises the steps of designating a rectangular area enclosing parts by the BSG and of concurrently compacting the area in the longitudinal and lateral directions by changing a size of the area. (see reference (4): Keishi Sakanushi, Tsuyoshi Kurasawa, Yasuhiro Takashima, Shigetoshi Nakatake, and Yoji Kajitani, "Concurrent Representation and Optimization of Placement and Route on BSG", TECHNICAL REPORT OF IEICE, VLD97-40, pp. 175–182, June 1991). However, this method has defects as follows. A first defect is that it is impossible to move both of circular parts mutually when the circular parts are in contact with each other in an oblique direction. A second defect is that it is impossible to compact the layout having the oblique routing or wiring.

SUMMARY OF THE INVENTION

It is therefore an object of this invention to provide a graphic layout compaction system and a graphic layout compaction method, which are capable of compacting a layout in both longitudinal and lateral directions at once.

Other objects of this invention will become clear as the description proceeds.

According to an aspect of this invention, a graphic layout compaction system is for compacting a layout where components and routes are placed on a two-dimensional space. The graphic layout compaction system comprises a calculator for calculating a movement limit area within which a first component can move in any directions towards a second component in consideration of a route bandwidth interposed therebetween. The route bandwidth is obtained by adding a necessary space to a width of particular routes put between the first component and the second component. A component compactor moves the first component on a position where the first component is not interfered with the movement limit area. A rerouting unit shapes the particular routes into shaped particular routes having configurations including oblique parts to reroute the shaped particular routes in a space between the first and the second components.

According to another aspect of this invention, a graphic layout compaction method is for compacting a layout where components and routes are placed on a two-dimensional space. The graphic layout compaction method comprises the steps of calculating a movement limit area within which a first component can move in any directions towards a second component in consideration of a route bandwidth interposed therebetween, the route bandwidth being obtained by adding a necessary space to a width of particular routes put between the first component and the second component, of compacting the components by moving the first component on a position where the first component is not interfered with the movement limit area, and of shaping the particular routes into shaped particular routes having configurations including oblique parts to reroute the shaped particular routes in a space between the first and the second components.

A recording medium to which this invention is applicable is for recording a program to make a computer execute processing for compacting a layout where components and routes are placed on a two-dimensional space. According to still another aspect of this invention, the above-mentioned recording medium is for recording the program to make the computer execute a first processing of calculating a movement limit area within which a first component can move in any directions towards a second component in consideration of a route bandwidth interposed therebetween, the route bandwidth being obtained by adding a necessary space to a width of particular routes put between the first component and the second component, a second processing of compacting the components by moving the first component on a position where the first component is not interfered with the movement limit area, and a third processing of shaping the particular routes into shaped particular routes having configurations including oblique parts to reroute the shaped particular routes in a space between the first and the second components.

BRIEF DESCRIPTION OF THE DRAWING

FIGS. 7A through 7H are views showing various kinds of data used in the graphic layout compaction system illustrated in FIG. 3;

FIG. 17 is a view showing a shortest route network graph datum used in the graphic layout compaction system illustrated in FIG. 15;

DESCRIPTION OF THE PREFERRED EMBODIMENTS

Figure 1:
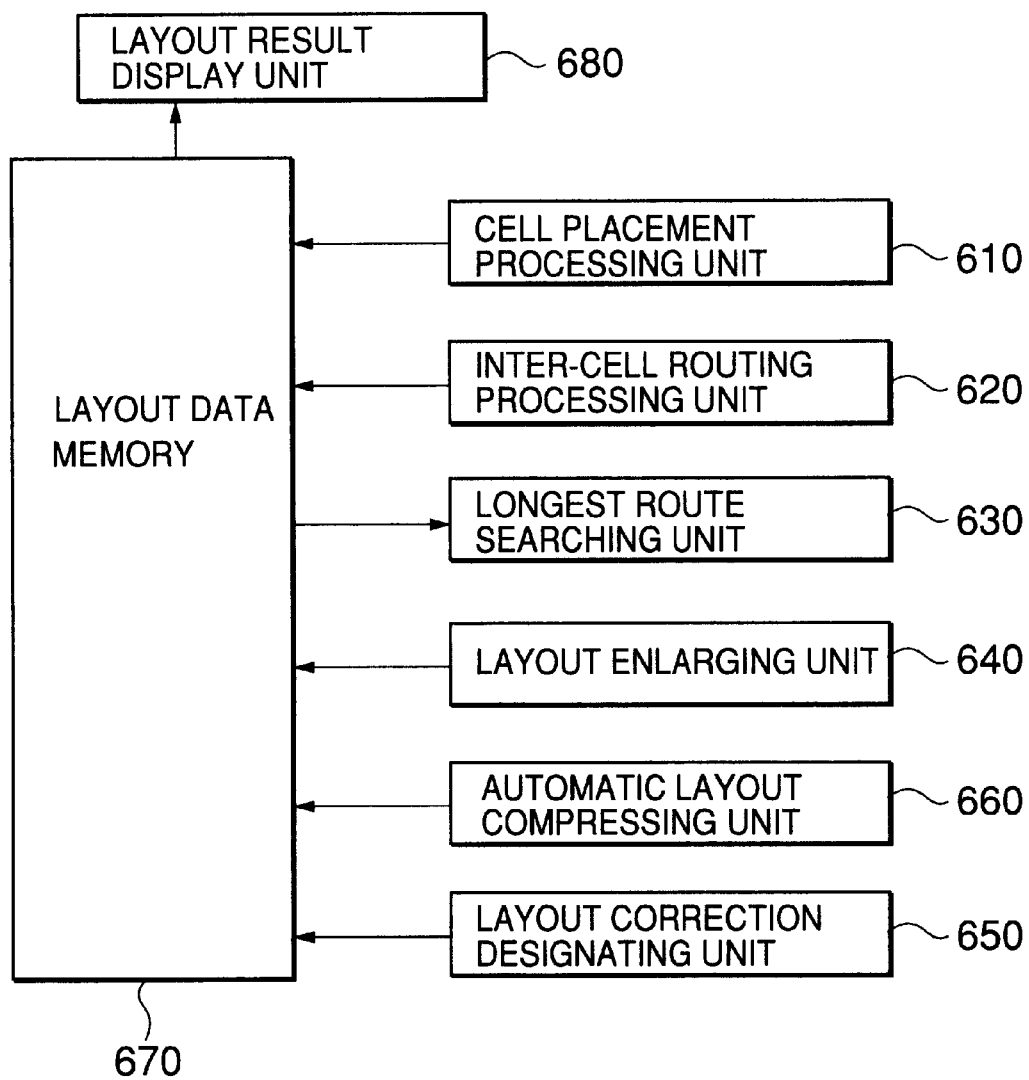
FIG. 1 is a block diagram of a conventional layout compaction system.
Figure 2:
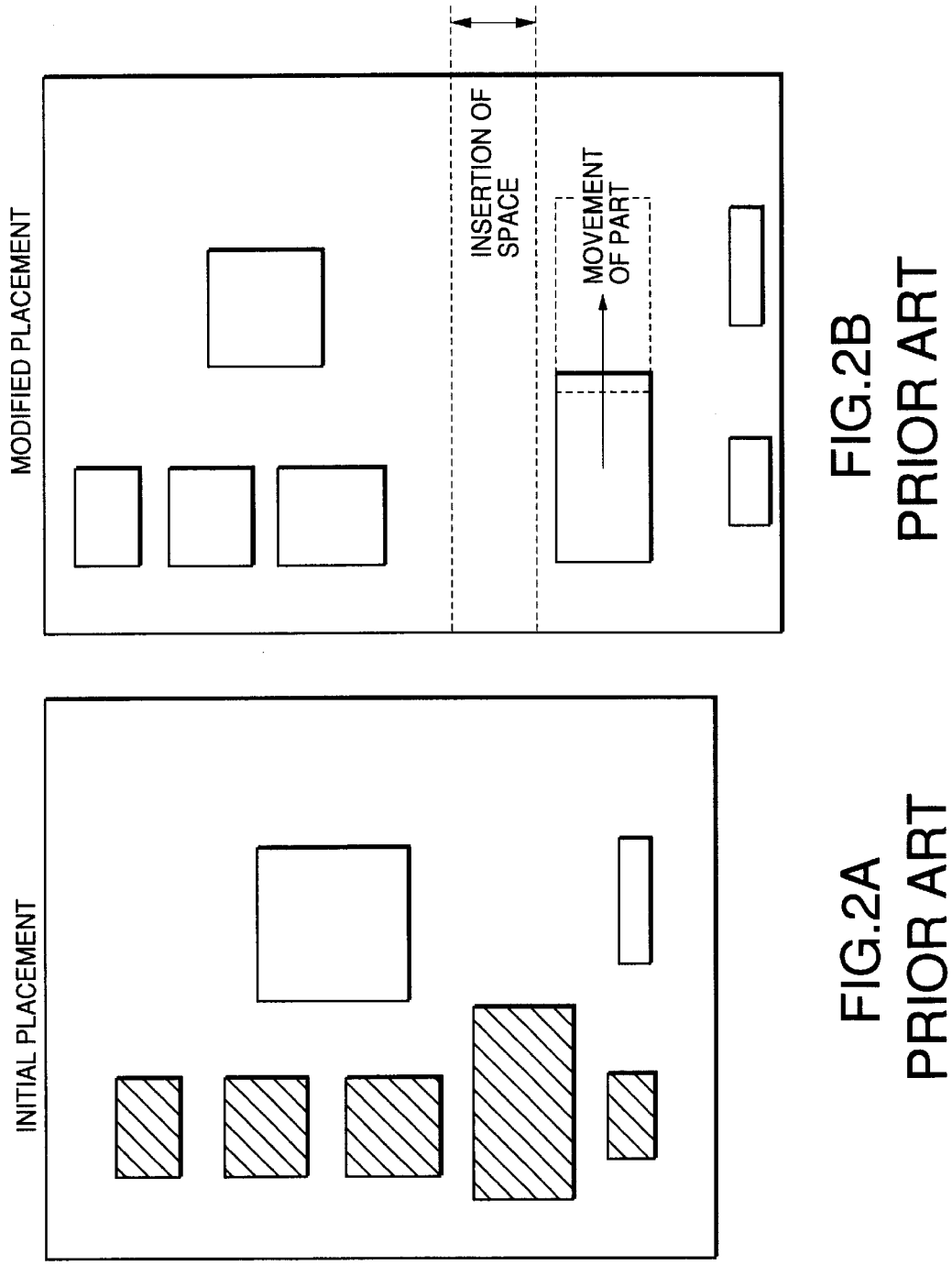
FIGS. 2A and 2B are views for describing an operation of the conventional layout compaction system.

Referring to FIGS. 1, 2A and 2B, a conventional layout compaction system will be described at first for a better understanding of this invention. FIG. 1 is a block diagram showing the conventional layout compaction system. FIGS. 2A and 2B collectively show views for use in describing an operation of the layout compaction system illustrated in FIG. 1.

As shown in FIG. 1, the layout compaction system comprises a cell placement processing unit 610, an inter-cell routing processing unit 620, a longest route searching unit 630, a layout enlarging unit 640, a layout correction designating unit 650, an automatic layout compressing unit (compaction unit) 660, a layout data memory 670, and a layout result display unit 680.

Referring to FIGS. 2A and 2B in addition FIG. 1, the operation of the layout compaction system will be described.

The cell placement processing unit 610 carries out processing of placement or arrangement for cells in the manner as is well known in the art and stores cell layout data indicative of a layout of the cells in the layout data memory 670. The inter-cell routing processing unit 620 carries out processing of routing between the cells in the manner as is well known in the art and stores routing layout data indicative of a layout of the routing in the layout data memory 670. The longest rout searching unit 630 searches a series of graphic elements having the longest route in the layout stored in the layout data memory 670 in order to compact a layout of each cell and the routing on an LSI chip into a smaller area and displays it in the layout result display unit 680. The layout enlarging unit 640 inserts a space crossing the longest route of its constraint graph in the layout as shown in oblique lines of FIG. 2A. Responsive to a command from an operator, the layout correction designating unit 650 moves a particular part from the longest route of the constraint graph so as to shorten the longest route. In the example being illustrated, the particular part is the second part from a lower end. In addition, the compaction unit 660 compacts the layout indicative of a corrected result in up and down of FIG. 2B.

However, in a case of carrying out compaction of the layout so as to reduce the layout in both longitudinal and lateral directions, the conventional compaction unit 660 reduces the layout in two steps so as to first reduce it in one direction (e.g. the longitudinal direction) and to subsequently reduce it in another direction (e.g. the lateral direction). Therefore, when the layout is first reduced in the longitudinal direction, the cells or the components crowd in the longitudinal direction and it results in preventing reduction of placement or arrangement on subsequently reducing placement or arrangement of the cells or the components and the layout of the routing or the wiring in the lateral direction, as mentioned in the preamble of the instant specification.

Throughout the present specification, technical terms are defined as follows. Components may comprise parts on a printed-circuit board or semiconductor cells in a large-scale semiconductor circuit. Each component has one or more component terminals which may be called the component. A layout comprises at least one layer of pattern. The pattern comprises routes or wires, terminals, via holes, and polygonal conductor configurations which are placed or arranged on a two-dimensional space. Each of the terminals, the via holes, and the polygonal conductor shapes may be also called the component terminal. Accordingly, the layout comprises the routes or the wires and the component terminals or the components. A graph consists of nodes and edges for connecting between the nodes. The nodes are also called vertices. The edges are also called branches.

Figure 3:
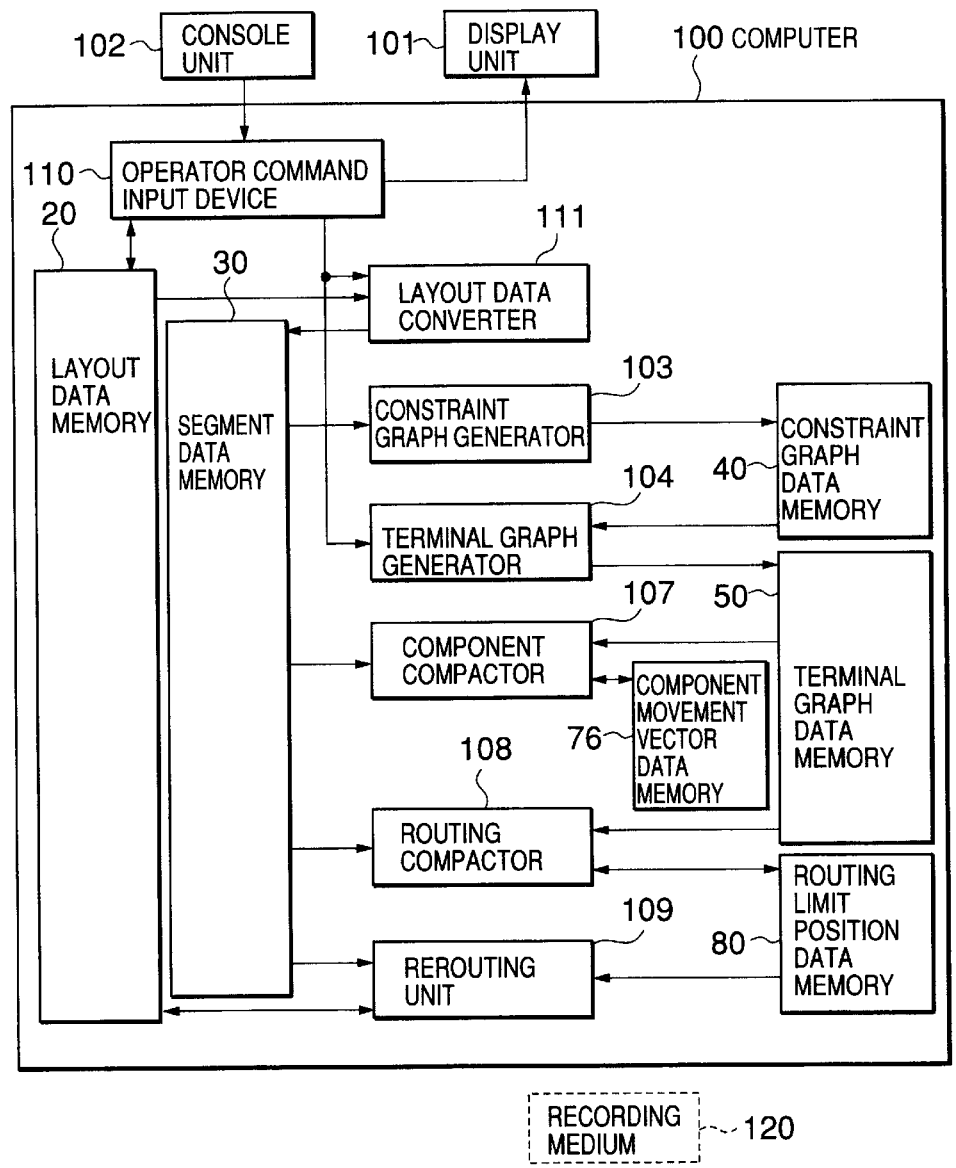
FIG. 3 is a block diagram of a graphic layout compaction system according to a first embodiment of this invention.

Referring to FIG. 3, the description will proceed to a graphic layout compaction system according to a first embodiment of this invention. FIG. 3 is a block diagram showing the graphic layout compaction system. The illustrated graphic layout compaction system comprises a computer 100 operable under control of a program, a display unit 101, and a console unit 102. The computer 100 may comprise a central processing unit, a processor, or a data processing unit. The display unit 101 may comprise a CRT display, a liquid crystal display, or the like. The console unit 102 may comprise a keyboard, a mouse, a tablet, or the like.

The computer 100 comprises a layout data memory 20, a segment data memory 30, a constraint graph data memory 40, a terminal graph data memory 50, a component movement vector data memory 76, a routing limit position data memory 80, a constraint graph generator 103, a terminal graph generator 104, a component compactor 107, a routing compactor 108, a rerouting unit 109, an operator command input device 110, and a layout data converter 111. These units roughly operates in the manner which will presently described.

The layout data memory 20 stores layout data indicative of a layout therein in the manner which will later be described. The layout has a layout area which has a layout center. That is, the layout area extends from the layout center radially. Read out of the layout data stored in the layout data memory 20, the layout data converter 111 decomposes the layout data into segment data indicative of a plurality of segments and stores the segment data in the segment data memory 30. Specifically, each configuration of the layout represented by the layout data is decomposed into the segments represented by the segment data. The segment may comprise a component terminal, a via hole, a wire, or the like.

From the segment data memory 30, the constraint graph generator 103 extracts the segment data representing the segments adjacent in a radial direction and generates constraint graph data representative constraint graphs connecting, as adjacent nodes, adjacent ones of the segments adjacent in the radial direction. The constraint graph generator 103 stores the constraint graph data in the constraint graph data memory 40.

Connected to the constraint graph data memory 40, the terminal graph generator 104 prepares or generates terminal graph data. Each terminal graph datum represents a terminal graph which comprises, as opposite nodes, a pair of component terminals in the vicinity of the layout terminal. In addition, the terminal graph datum represents an octagonal relative limit movement amount indicative of a movement limit area within which one of the opposite nodes is allowed to move towards the other node. The terminal graph generator 104 stores the terminal graph data in the terminal graph data memory 50. In other words, the terminal graph generator 104 serves as a calculator for calculating the movement limit area which a first component can move in any directions towards a second component in consideration of a route bandwidth interposed therebetween, in the manner which will later become clear. The route bandwidth is obtained by adding a necessary space to a width of particular routes put between the first component and the second component.

In the manner which will later become clear, the component compactor 107 compacts the components and places or arranges the components. In other words, the component compactor 107 moves the first component on a position where the first component is not interfered with the movement limit area.

Connected to the segment data memory 30 and the terminal graph data memory 50, the routing compactor 108 generates or prepares routing (wiring) limit position data each of which represents a routing (wiring) limit position of an octagonal configuration along which routes or wires are bent the contour of one of the component terminals sandwiching the routes or wires. The routing compactor 108 stores the routing (wiring) limit position data in the touting (wiring) limit position data memory 80.

Connected to the layout data memory 20, the segment data memory 30, and the routing (wiring) limit position data memory 80, the rerouting (rewiring) unit 109 replaces or rearranges the routes or the wires by shaping the routes (wires) into shaped routes (wires) having a configuration including oblique or diagonal parts. The rerouting (rewiring) unit 109 stores renewed layout data indicative of rerouted (rewired) results in the layout data memory 20. In other words, the rerouting unit 109 shapes the particular routes into shaped particular routes having configurations including oblique parts to reroute the shaped particular routes in a space between the first and the second components.

Figure 4:
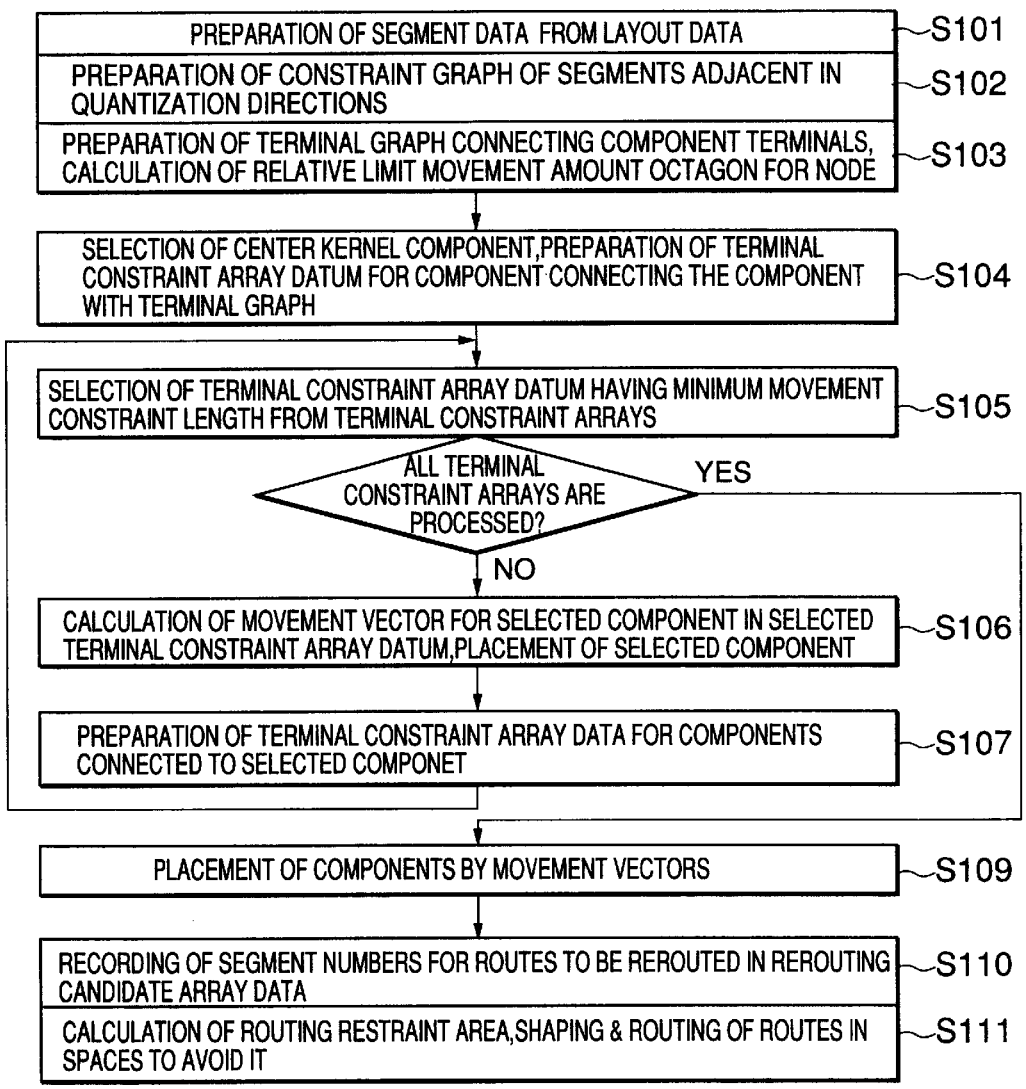
FIG. 4 is a flow chart for describing an entire operation of the graphic layout compaction system illustrated in FIG. 3.
Figure 5:
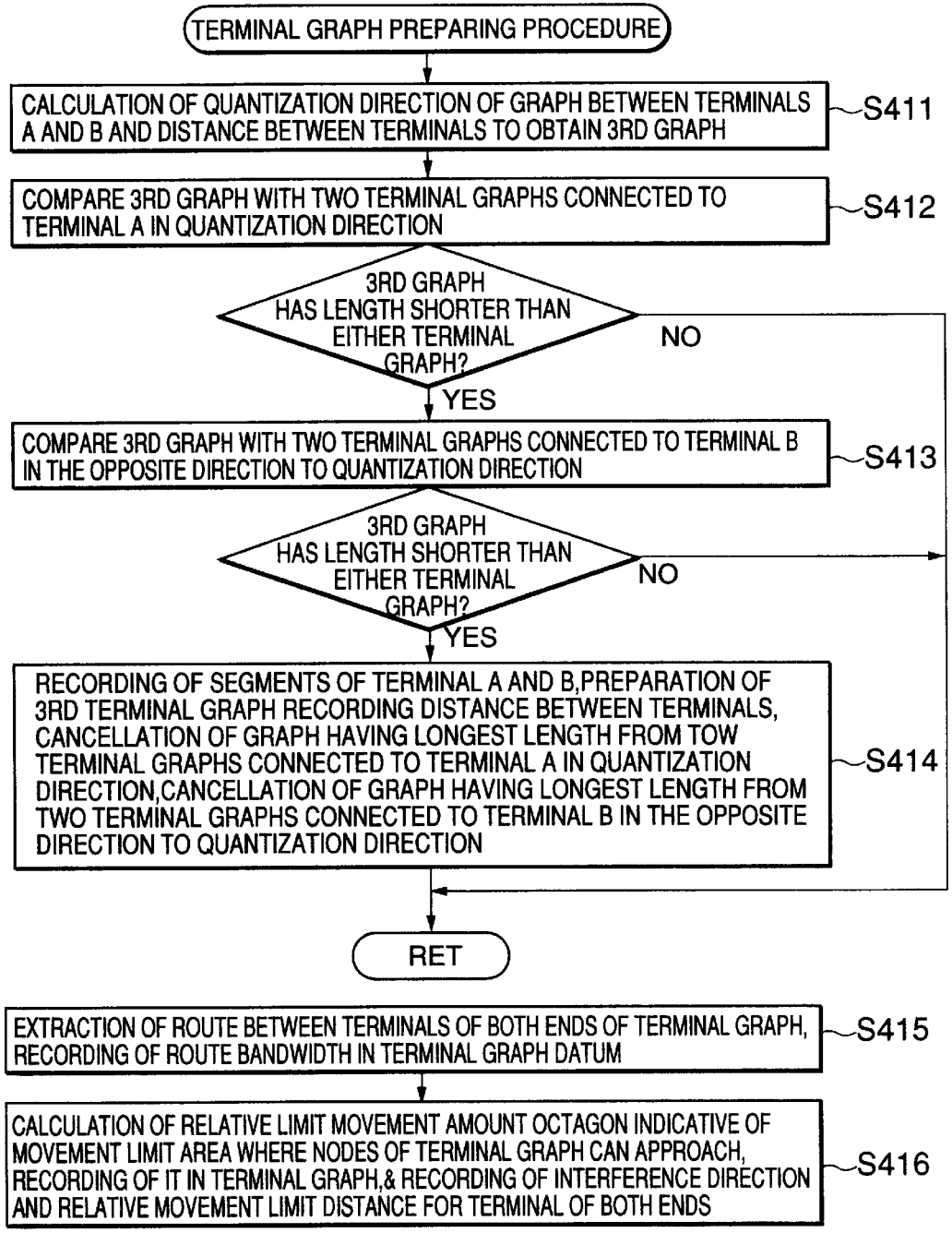
FIG. 5 is a flow chart for describing in detail a part of the operation in FIG. 4.
Figure 6A:
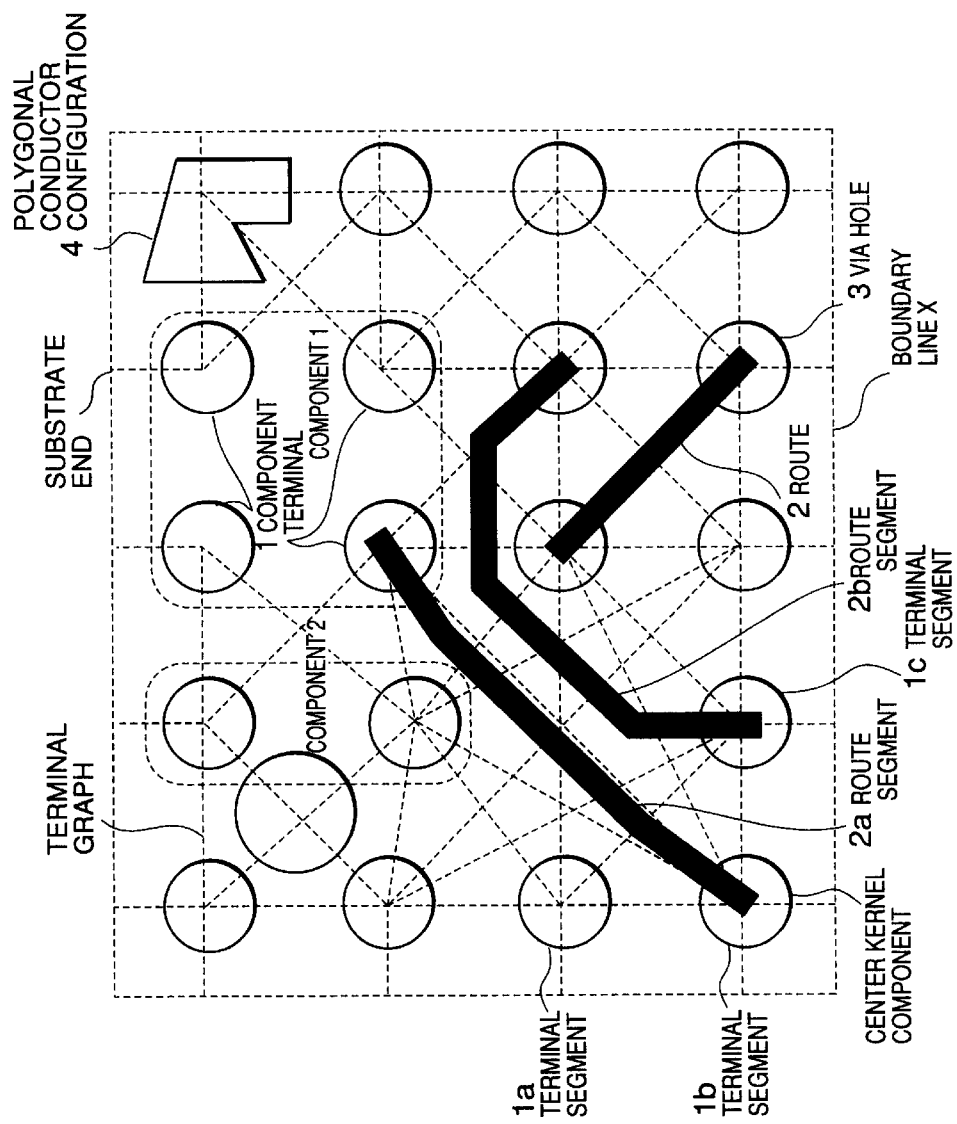
FIGS. 6A through 6C are views showing layouts for use in describing a concrete operation of the graphic layout compaction system illustrated in FIG. 3.
Figure 6B:
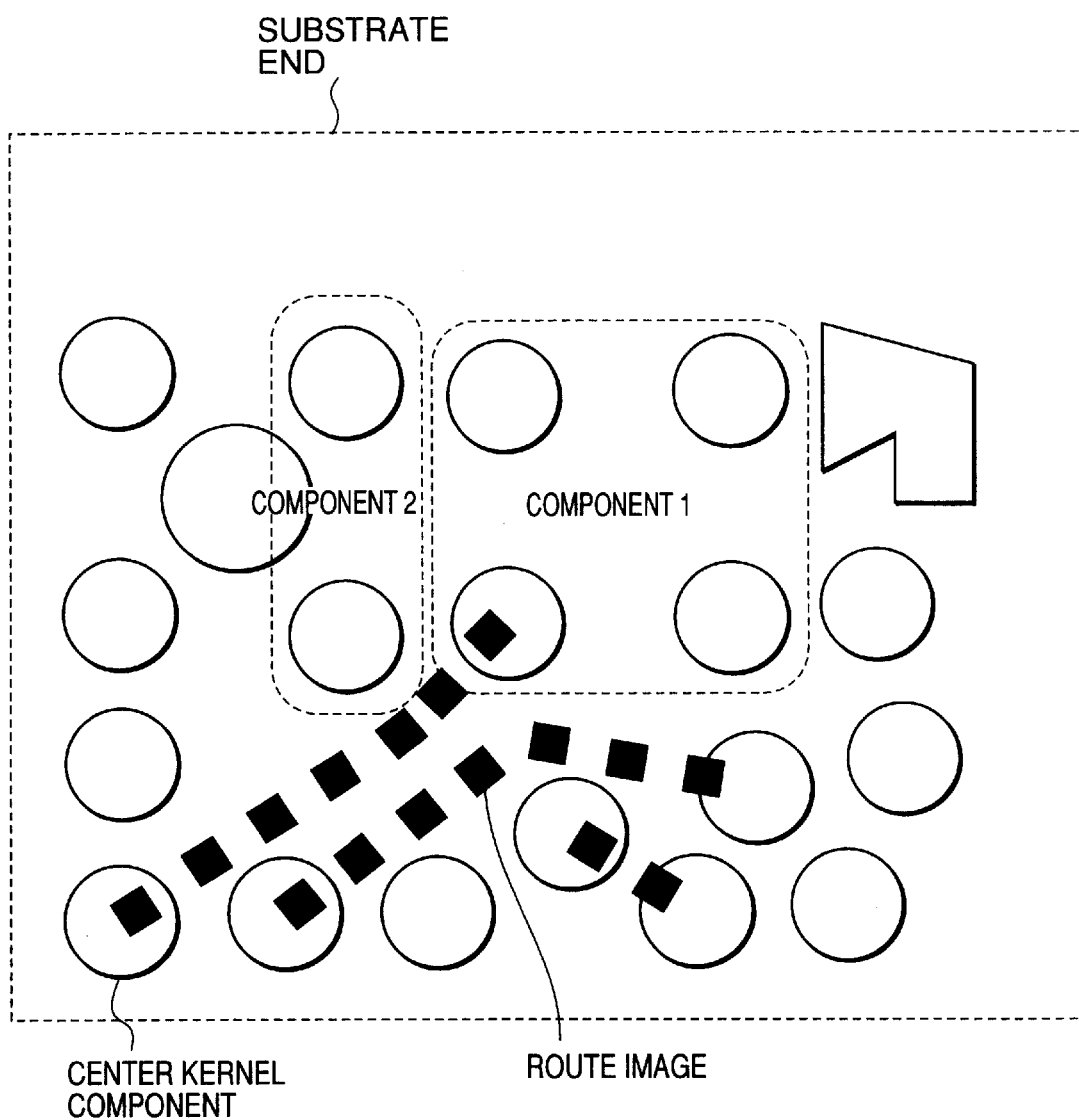
Figure 6C:
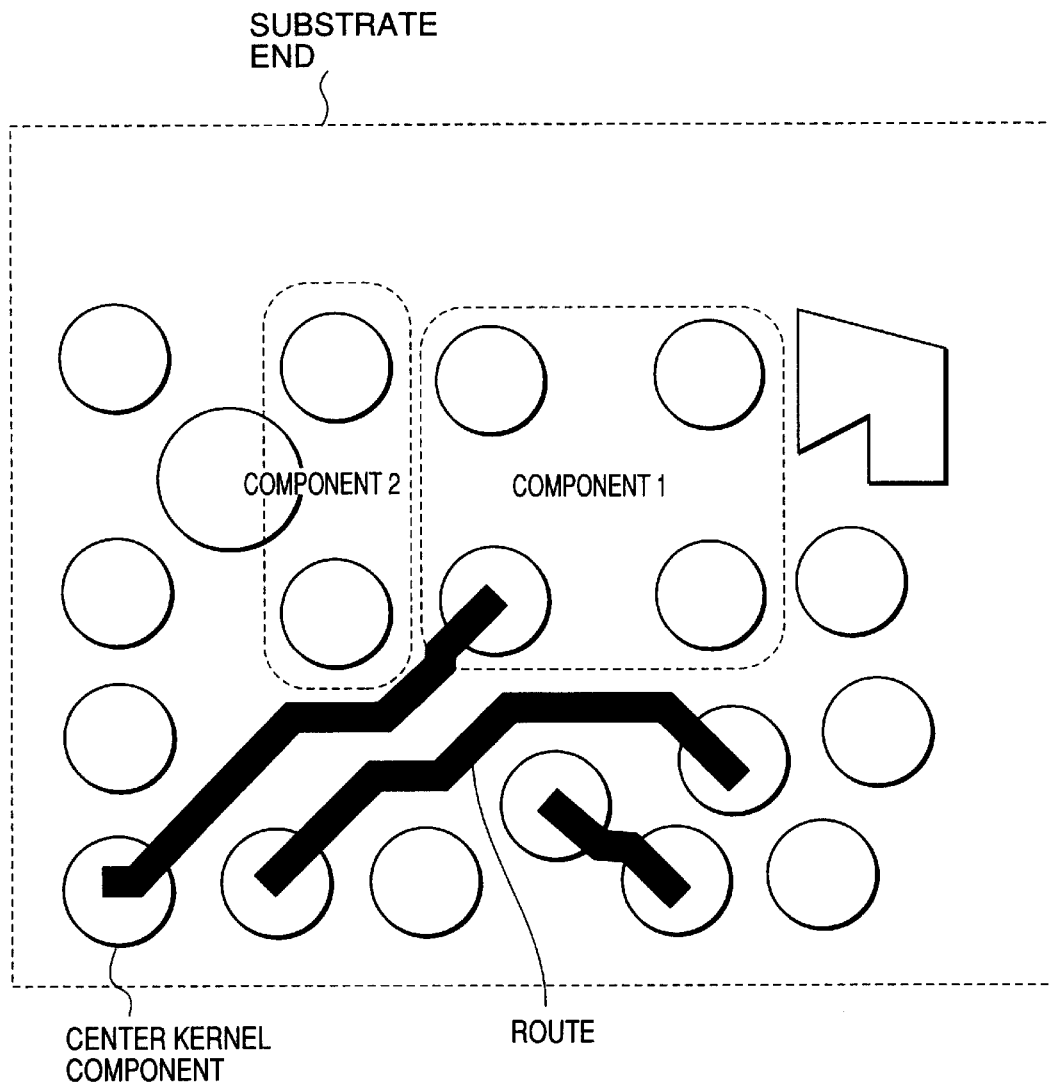

Referring now to FIGS. 4 and 5 together with FIGS. 6A through 6C, general operation of the graphic layout compaction system illustrated in FIG. 3 will be described. FIGS. 6A through 6C are plan views showing a layout pattern or a design for use in describing the operation of the graphic layout compaction system illustrated in FIG. 3. FIG. 6A shows an initial layout of a printed-circuit board as a processing object in the first embodiment and FIG. 6C shows a processed layout pattern. In FIG. 6A, each component terminal, each routes (wire), each via hole, and each polygonal conductor configuration are depicted at numerals of 1, 2, 3, and 4, respectively. In the example being illustrated in FIG. 6A, the initial layout comprises terminal segments 1*a*, 1*b*, and 1*c* as the component terminals 1, route (wire) segments 2*a* and 2*b* as the routes (wires) 2, and first and second components. The terminal segments 1*b* is called a center kernel component. In addition, the terminal graph, a substrate end, and a boundary line X are depicted at broken lines in FIG. 6A.

At a stop S101, supplied with the layout data indicative of the initial layout illustrated in FIG. 6A, the layout data converter 111 prepares the segment date from the layout data. Specifically, various graphic elements in the layout pattern in FIG. 6A, such as the component terminals, the via holes, the wires, polygonal conductor configurations, component contours, and board contour lines, are decomposed per each layer plane into the segments each of which is approximated to an octagonal configuration. The segment datum representative of each segment has data structures illustrated in FIGS. 7A and 7B.

More specifically, the layout data converter 111 places or arranges configuration of the component contours on a layer plane. In addition, the layout data converter 111 decomposes the routes or the wires for each of a signal layer plane and a power supply and ground layer into route (wire) segments divided at bending points and intersecting points to prepare or generate the segment data indicative of the route (wire) segments and decomposes the polygonal conductor configurations into a plurality of sides to prepare or generate the segment data indicative of the sides.

The layout data converter 111 assigns the segment data of the components decomposed per layer plane with the individual component numbers 32. In addition, the layout data converter 111 assigns the via holes with the individual component numbers 32 for the respective via holes and assigns the board contour lines with the component numbers 32 for the board contour lines in common. These component numbers 32 are recorded in the segment data. In the present specification, the board contour and the via holes are also called the components.

FIGS. 7A and 7B are views showing the data structure of the segment datum prepared by the layout data converter 111. FIG. 7A shows the data structure of the segment datum indicative of each of the component termina 1 and the via holes 3 while FIG. 9B shows the data structure of the segment datum indicative of each of the routes (wires) 2 and the polygonal conductor configurations 4.

In FIG. 7A, the segment datum indicative of the component terminal 1 or the via hole 3 includes the component number 32. The component number 32 is common to all segment of the terminals associated with a single component. The component number 32 is common to all segment data indicative of a signal via hole 3 in all layer planes.

In addition, as illustrated in FIG. 7D, the segment datum indicative of the component terminal 1 or the via hole 3 includes a configuration number 36 of a configuration datum 35 (FIG. 9D) representing the configuration of the segment. The segment datum indicative of the routes (wire) 2 connected to the component terminal 1 or the via hole 3 includes a pair of position numbers 33 for first and second ends of the route (wire) 2. Each of the position numbers 33 of the route (wire) 2 is common of that of the component terminal 1, the via hole 3, or the end of another route (wire) 2 connected to each corresponding end of the route (wire) 2. In addition, the segment datum indicative of the route (wire) 2 includes the configuration number 36 representative of the width of the route (wire).

As illustrated in FIG. 7C, a position datum 34 includes the position number 33, X and Y coordinate values, a layer plane number, and the component number 32 associated with the position number 33. As illustrated in FIG. 7D, the configuration of each graphic element is described and stored as the configuration datum 35. The configuration datum 35 includes the configuration number 36 of the graphic element, and the widths of the graphic element in the longitudinal direction, the lateral direction, a first diagonal direction (rotated by 45° counterclockwise from the lateral direction), and a second diagonal direction (rotated by 45° clockwise from the lateral direction) to represent the graphic pattern as an octagonal configuration. The longitudinal direction is called the direction of Y while the lateral direction is called the direction of X.

In addition, the segment datum indicative of the polygonal conductor configuration 4 is prepared or generated for a line segment as each side thereof and has the data structure illustrated in FIG. 7B, including the indication of a fixed configuration.

Now, in the initial layout of the printed-circuit board, a gap between adjacent ones of the routes (wires) 2, the component terminals 1, the via holes 3, and the polygonal conductor configurations 4 may be smaller than a minimum allowable gap defined in the design rule. This is because such a smaller gap is modified in a processing process according to the first embodiment in the manner which will later become clear.

Subsequently, at a step S102, the constraint graph generator 103 reads per layer plane the segment data from the segment data memory 30 in order of the X coordinate values in the layer plane, determines the order of placement or arrangement of the segment data in the direction of Y with reference to the Y coordinate values to obtain each pair of adjacent ones of the segment numbers 31 adjacent in the direction of Y as one of quantization directions, and prepares or generates Y-direction constraint graph data each of which represents the above-mentioned pair of the segment numbers 31 with the data structure as illustrated in FIG. 7F. In addition, the constraint graph generator 103 calculates the order of the constraint graph data in the order of the segment numbers 31 included therein from the lowermost one in the direction of Y and records the order of constraint graph numbers indicative of the Y-direction constraint graph data in Y-direction constraint graph order data (not shown). Likewise, the constraint graph generator 103 prepares or generates X-direction constraint graph data for the direction of X as one of the quantization directions and records the order of the constraint graph data thereof in X-direction constraint graph order data (not shown). Similarly, the constraint graph generator 103 prepares or generates first and second diagonal-direction constraint graph data for the first and the second diagonal directions and first and second diagonal-direction constraint graph order data (not shown).

Figure 8A:
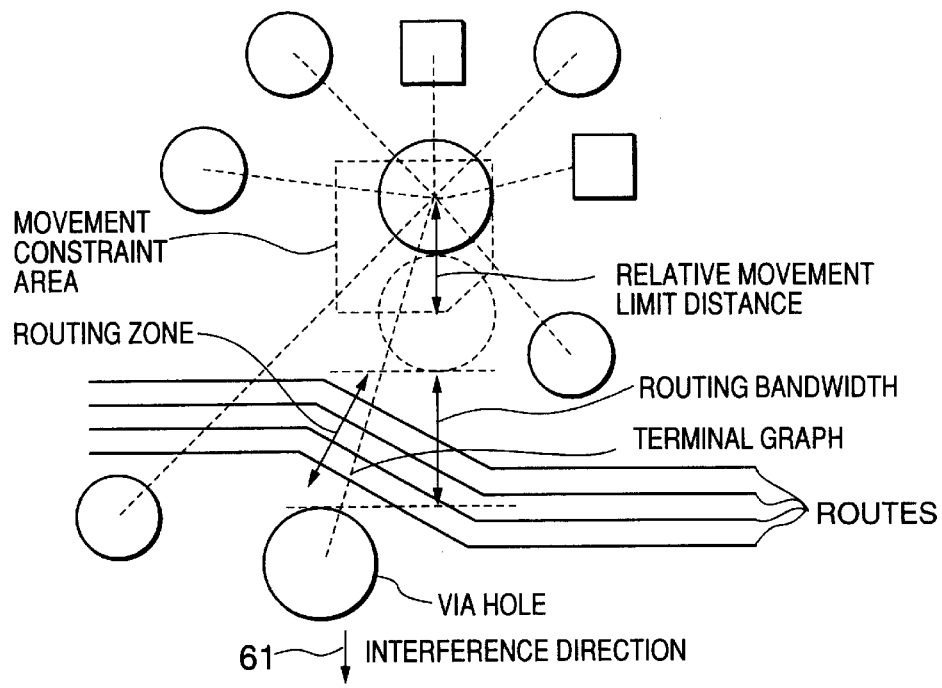
FIGS. 8A and 8B are views showing layouts for use in describing an operation of the graphic layout compaction system illustrated in FIG. 3.

Subsequently, at a step S103, the terminal graph generator 104, as shown in FIG. 8A, extracts component terminals adjacent in longitudinal, lateral, and diagonal (oblique) directions based on a particular component terminal, calculates a route connecting a component terminal (except for a wire) of the layout center side with an adjacent component terminal (except for a wire) through adjacent wires, and prepares or generates the terminal graph data each of which indicates a terminal graph having both component terminals as nodes. The terminal graph datum has data structure as illustrated in FIG. 7G. The terminal graph generator 104 also prepares or generates the terminal graph data each of which indicates a terminal graph having the component contour as the nodes.

Referring to FIG. 5, processing at the step S103 will be described in detail. At the step S103, the terminal graph generator 104 reads all of the segment data indicative of the component terminals from the extreme left end of the substrate toward the extreme right end of the substrate and prepares or generates the terminal graph data (which have the data structure illustrated in FIG. 7G) for combinations of the component terminals (which include the via holes) in accordance with a terminal graph preparing procedure of steps S411 to S414 illustrated in FIG. 5. In addition, in the similar manner as described above, the terminal graph generator 104 prepares or generates the terminal graph data for combinations of the component terminals from the upper end of the substrate toward the lower end of the substrate. When processing related to all of the component terminals comes to an end, the terminal graph preparing procedure proceeds to a step S415 in FIG. 5.

As illustrated in FIG. 5, in the terminal graph preparing procedure, the terminal graph generator 104 first carries out processing of the step S411. At the step S411, supplied with a graph (which is called a third graph) connecting a component terminal A with a component terminal B, the terminal graph generator 104 calculates a direction connecting from the component terminal A to the component terminal B as a selected one from the quantization directions obtained by quantizing or dividing any directions in the longitudinal, the lateral, and the first and the second diagonal directions by an angle of 45°. In addition, the terminal graph generator 104 obtains a distance between the component terminal A and the component terminal B as a length of the third graph.

The step S411 is followed by the step S412 at which the terminal graph generator 104 reads, from the terminal graph data memory 50, two terminal graph data indicative of two terminal graphs having, as the nodes, the component terminal A and two component terminals connecting with the component terminal A in the selected quantization direction and compares the length of the third graph with two lengths of the above-mentioned two terminal graphs. When the length of the third graph is shorter than either one of the two lengths of the above-mentioned two terminal graphs, the step S412 is succeeded by a step S413 at which the terminal graph generator 104 reads, from the terminal graph data memory 50, two terminal graph data indicative of two terminal graphs having, as the nodes, the component terminal B and two component terminals connecting with the component terminal B in the opposite direction to the selected quantization direction and compares the length of the third graph with two lengths of the last-mentioned two terminal graphs.

When the length of the third graph is shorter than either one of the two lengths of the last-mentioned two terminal graphs, the step S413 proceeds to the step S414 at which the terminal graph generator 104 records the selected quantization direction of the third graph as a direction of graph and prepares or generates the terminal graph data including the segment numbers 31 indicative of both component terminals, as illustrated in FIG. 7G. In this event, the terminal graph generator 104 prepares or generates the terminal graph data including no routing (wiring) band. In addition, the terminal graph generator 104 erases, from the terminal graph data memory 50, one of the two terminal graph data that indicates the terminal graph connecting with the component terminal A, in the selected quantization direction that has the longest length and erases, from the terminal graph data memory 50, one of the two terminal graph data that indicates the terminal graph connecting with the component terminal B in the opposite direction to the selected quantization direction that has the longest length. The above-mentioned processing is the terminal graph preparing procedure by the terminal graph generator 104.

At the step S415 in FIG. 5, the terminal graph generator 104 reads, from the constraint graph data memory 40, all of the constraint graph data from the lower substrate end toward the upper substrate end in the order in which the Y-direction constraint graph order data stores. Likewise, the terminal graph generator 104 reads, from the constraint graph data memory 40, all of the constraint graph data from the extreme left substrate end toward the extreme right substrate end in the order in which the X-direction constraint graph order data stores. Furthermore, the terminal graph generator 104 reads, from the constraint graph data memory 40, all of the constraint graph data in the first and the second diagonal directions in the order in which the first and the second diagonal-direction constraint graph order data store. In addition, the terminal graph generator 104 extracts, from the terminal graph data memory 50, the terminal graph data including the segment numbers 31 which are already recorded in the constraint graph date read out. Under the circumstances, when the routes (wires) having the segment numbers 31 recorded in the constraint graph data intersect a straight line connecting both terminals in the terminal graph represented by the terminal graph data, the terminal graph generator 104 records the segment numbers 31 for the routes (wires) in the terminal graph data in order between the both terminals, calculates a sum of a width of the wires and a necessary space to obtain a routing (wiring) bandwidth, and records the routing (wiring) bandwidth in the terminal graph data memory 50.

The step S415 is followed by a step S416 at which the terminal graph generator 104 calculates, as illustrated in FIG. 8A, a relative movement limit distance 74 by subtracting widths of the opposite segments and the routing (wiring) bandwidth from a projected distance for the graph in the quantization direction (interference direction 61) of the terminal graph indicated by the terminal graph datum and records the relative movement limit distance 74 in the terminal graph data memory 50.

Figure 8B:
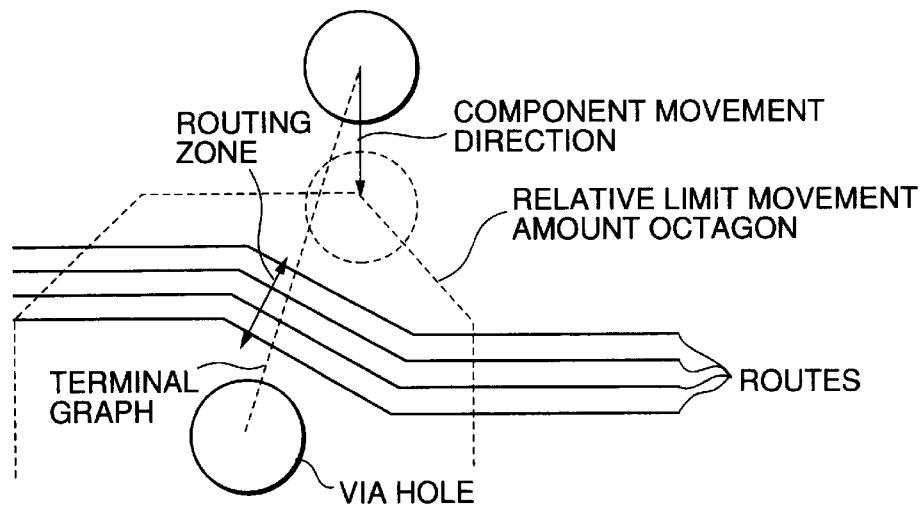

Subsequently, in the manner which will later be described, the terminal graph generator 104 calculates, as illustrated in FIG. 8B, a movement limit area or a relative limit movement amount octagon where the segment (an outside node) in the layout area (a branch-side node) represented by the terminal graph data stored in the terminal graph data memory 50 allows to approach an inside node in the layout area (a root-side node) in consideration of the routing (wiring) band (which may be bent freely). That is, the terminal graph generator 104 generates or prepares an octagonal configuration datum 35 (which has data structure illustrated in FIG. 9D) representing a width in the longitudinal, the lateral, and the diagonal directions to record the configuration number 36 of the configuration data 35 in the terminal graph data memory 50. The width represented by the octagonal configuration datum 35 is equal to a width toward the branch-side node in the configuration having a center in the root-side node that is obtained as a three-term sum of the width of the segment of the root-side node, the width of the segment toward the root-side node from the branch-side node, and the routing (wiring) bandwidth with respect to coordinates having the branch-side node in the terminal graph data as a center. This configuration is called the relative limit movement amount octagon. In a case where the relative limit movement amount octagon is installed in a position of the root-side node, a vector from the branch-side node to this configuration represents a limit movement distance allowing to make a center of the terminal of the branch-side node move toward the root-side node. In addition, when one having inverted sign in the coordinates of the configuration data 35 representing the relative limit movement amount octagon is installed in a position of the branch-side node, this configuration represents a limit movement distance allowing to make a center of the terminal of the root-side node move toward the branch-side node.

Figure 9A:
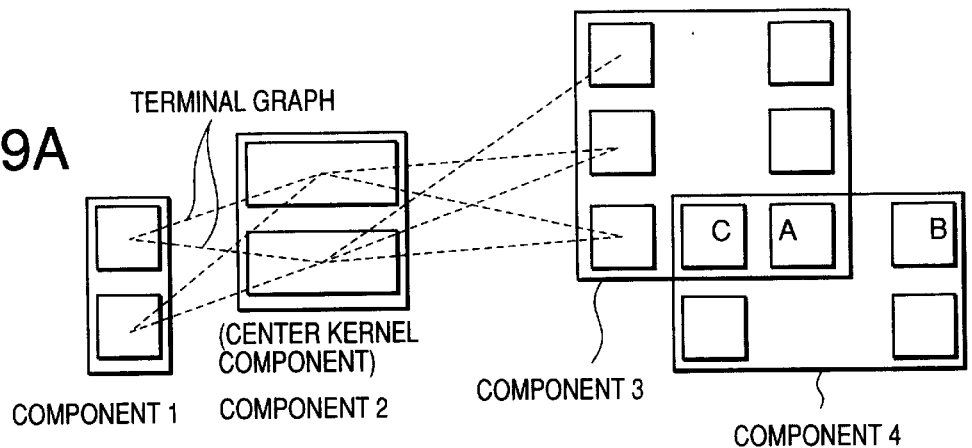
FIGS. 9A through 9C are views showing layouts for use in describing another operation of the graphic layout compaction system illustrated in FIG. 3.
Figure 9B:
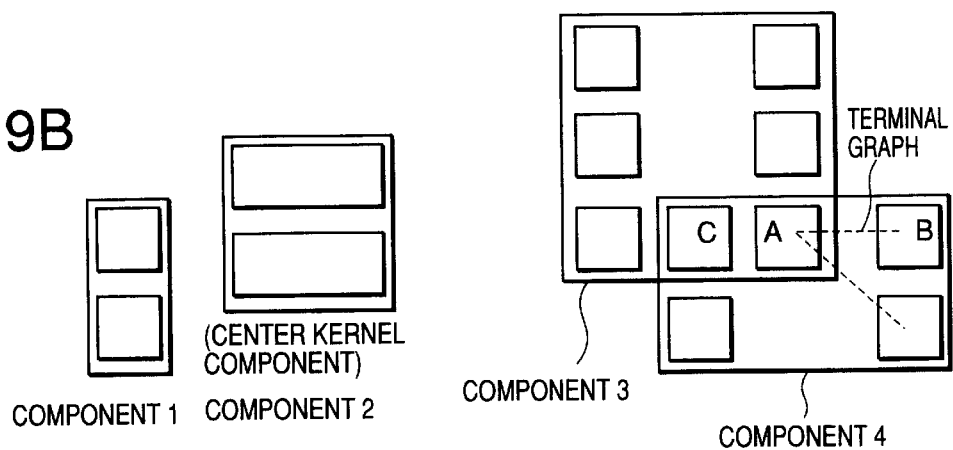

Turning back to FIG. 4, the step S103 proceeds to a step S104 at which the operator command input device 110 receives a command from the operator and selects the center kernel component (the component 2) as illustrated in FIG. 9A. The selected center kernel component may be a component about the center of the layout area, a component about an end of the layout area, the substrate end, or a corner of the substrate end.

Figure 10A:
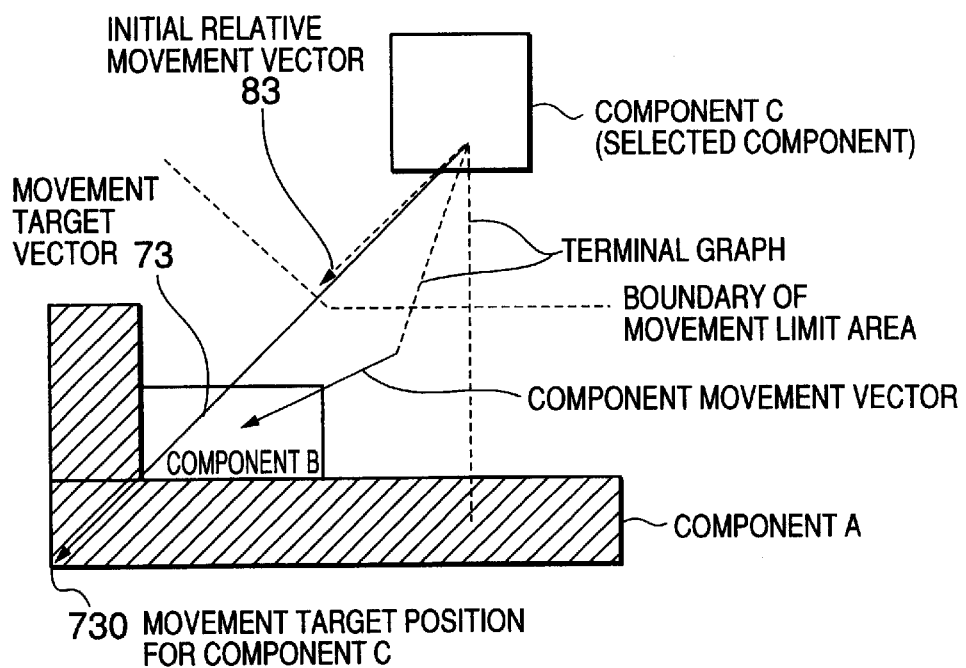
FIGS. 10A and 10B are views showing layouts for use in describing still another operation of the graphic layout compaction system illustrated in FIG. 3.

Subsequently, the operator command input device 110 calculates per component, as a component movement target vector, a vector setting from an initial position of a selected component to the center kernel component and stores the component movement target vector datum 73 indicative of the component movement target vector (as illustrated in FIG. 10A) in a component movement target vector data memory (not shown).

Subsequently, the operator command input device 110 extracts, from the terminal graph data memory 50, per terminal of the center kernel component all of the terminal graph data each of indicates the terminal graph connecting with the terminal in question. An opposite component connecting with the terminal graph represented by the terminal graph datum is called a movement reserved component and a terminal thereof is called a movement reserved terminal. The operator command input device 110 extracts, among all of the terminal graph date, only the terminal graph data where a direction of the vector turning from a position of the movement reserved terminal to the component terminal of the selected component lies within 90° on the basis of the direction represented by the component movement target vector data. Thereafter, the operator command input device 110 stores a terminal constraint array 75 (which have data structure as illustrated in FIG. 7H) including the component number 32 of the branch-side node, the component number 32 of the center kernel component, and a terminal graph number 79 in a terminal constraint array memory (not shown). In addition, the operator command input device 110 stores the terminal constraint array 75 including a processing flag indicative of "unprocessed", the interference direction 61 represented by the terminal graph data, and the relative movement limit distance 74 in the terminal constraint array memory. The terminal constraint array 75 represents reservation of the component to be gathered to a group of the center kernel components and a movement direction thereof.

The step S104 is succeeded by a step S105 at which the component compactor 107 moves the components in the manner which will presently be described Specifically, the component compactor 107 selects, as a selected terminal constraint array 75, one having the minimum relative movement limit distance 74 among the terminal constraint arrays 75 having the processing flags 78 indicative of "unprocessed", and records "processed" in the processing flag 78 of the selected terminal constraint array 75. When all of the terminal constraint array 75 are processed, the step S105 proceeds to a step S109.

On the other hand, when all of the terminal constraint arrays 75 are not processed, the step S105 is followed by a step S106 at which the component compactor 107 calculates a component movement vector data for placing or arranging a selected component having the component number 32 in the selected terminal constraint array 75 with the selected component gathered about the center kernel component in the interference direction 61 (selected direction) in the manner which will be presently described.

More specifically, as illustrated in FIG. 8A, the component compactor 107 first calculates a movement constraint area representative of a movement constraint of the component terminal in the interference direction 61 as follows. That is, as illustrated in FIG. 10A, the component compactor 107 extracts all of the terminal constraint arrays 75 including the component numbers 32 identical with that of the selected component (the component C) to obtain the component number 32 of the center kernel component and the terminal graph number 79 included in the terminal constraint array 75 in question. Subsequently, the component compactor 107 adds the relative movement limit distance 74 of the selected component (the component C) represented by the terminal constraint array 75 in the interference direction 61 to a component value of a vector in the interference direction 61 that is obtained by subtracting the component movement vector data for the selected component from the component movement vector data for the component having the component number 32 to obtain an added value as a width of the movement constraint area in the interference direction 61. Each width of the movement constraint area in the interference direction 61 is renewed the minimum value calculated using by the terminal constraint array 75. The minimum value of the movement constraint area in the interference direction 61 may be a minus value.

Figure 10B:
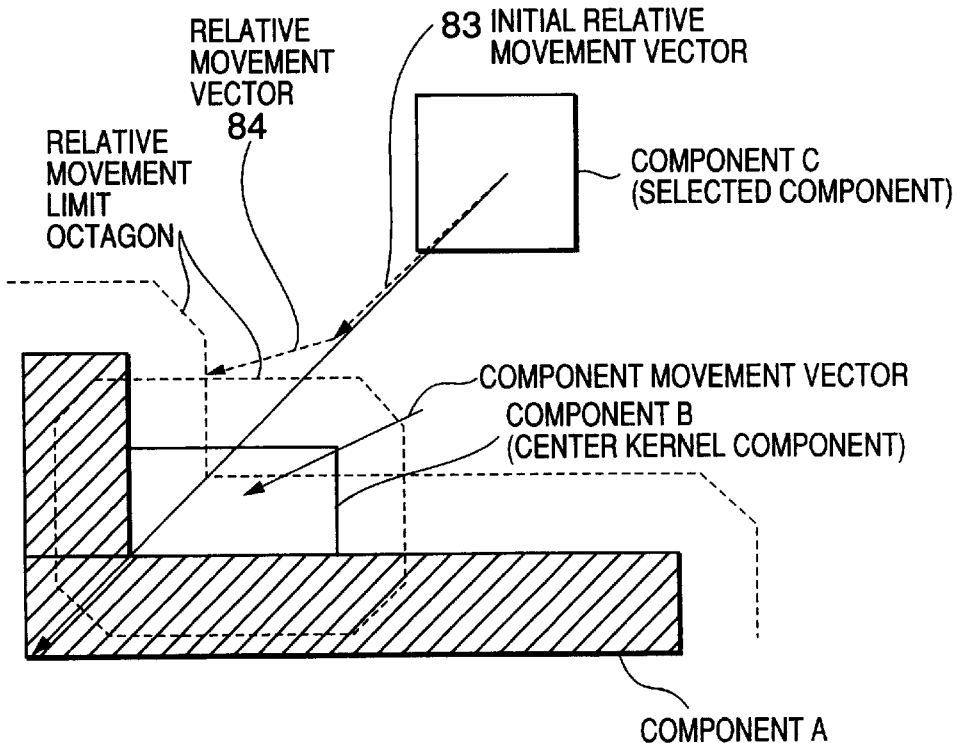

The component compactor 107 calculates a vector datum connecting a position where the component terminal of the selected component (the component C) is moved by the component movement vector indicated by the component movement vector data stored with a movement target position 730 (see FIG. 10A), and calculates a limited vector having a length where the vector indicated by the vector datum is limited in a crossing with a boundary of the movement constraint area to obtain an initial relative movement vector datum 83 indicative of the limited vector as shown in FIGS. 10A and 10B. Subsequently, the component compactor 107 calculates a vector datum indicative of a vector arriving from a tip of the initial relative vector indicated by the initial relative vector datum 83 for the selected component to the movement target position 730 to obtain a relative movement vector datum indicative of the vector datum (see FIG. 10B).

In addition, the component compactor 107 obtains the component numbers 32 of the center kernel component and the terminal graph numbers 79 included in all of the terminal constraint arrays 75 including the component number 32 identical with that of the selected component (the component C). Subsequently, the component compactor 107 installs the relative limit movement amount octagon of the component terminal (the center kernel component terminal) of the center kernel component (the component B), which represented by the terminal graph datum including the terminal graph number in question, in a position where the center kernel component (the component B) moves by the component movement vector indicated by the component movement vector data (which have a value of zero in the center kernel component initially selected).

After the relative limit movement amount octagon is installed in all of the center kernel components (the components A and B), the component compactor 107 extends the relative movement vector datum 84 from a tip of the initial relative movement vector indicated by the initial relative movement vector data 83 extended from a position where the component terminal of the selected component (the component C) is moved by the component movement vector indicated by the component movement vector data already stored. Subsequently, the component compactor 107 limits the length of the relative movement vector indicated by the relative movement vector datum 84 to a crossing position where the relative movement vector indicated by the relative movement vector data first crosses the third component (the components A, B). In addition, the component compactor 107 calculates a direction and a length where the relative movement vector indicated by the relative movement vector datum 84 has the maximum length by shifting the direction of the relative movement vector indicated by the relative movement vector datum 84 within a range between an initial orbit of the relative movement vector indicated by the relative movement vector data 84 and a shifted point within a predetermined distance thereof. As regards the relative limit movement amount octagon allowing to dissolve an intersection with the relative movement vector indicated by the relative movement vector data 84 by this shifting, the component compactor 107 calculates an intersection between the relative movement vector indicated by the relative movement vector data 84 and another relative limit movement amount octagon outside an area of the first-mentioned relative limit movement amount octagon.

The component compactor 107 adds the relative movement vector datum 84 to the stored component vector datum and the initial relative vector datum 83 to store an added result as the latest component movement vector datum (see FIGS. 10A and 10B) of the selected component (the component C) in the component movement vector data memory 76 (FIG. 3).

The step S106 is followed by a step S107 at which the component compactor 107 includes the selected component (the component 3 in FIG. 9B) among a group of the center kernel components and reserves the component to be gathered about the group of the center kernel components in the manner which will presently be described. The component to be gathered is called a movement reserved component.

Figure 9C:
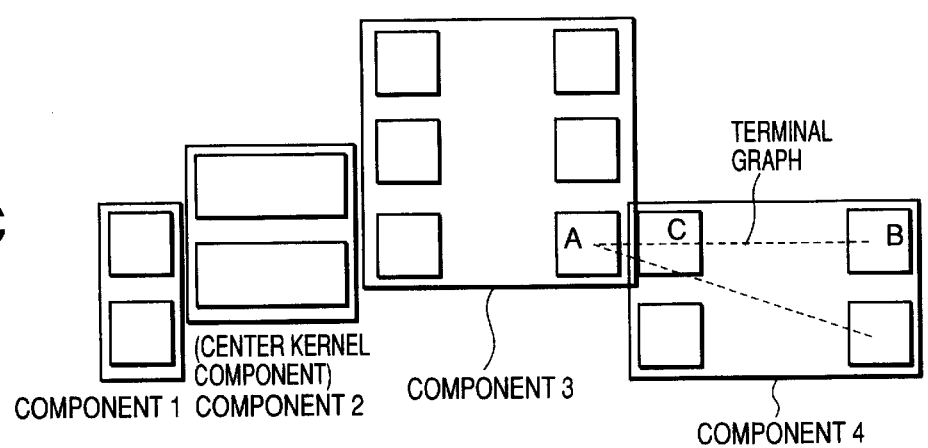

Specifically, the component compactor 107 reads, from the terminal graph data memory 50, all of the terminal graph data indicative of the terminal graphs connecting with all of the component terminals (processing terminals: for example, a terminal A) of the selected component (the component 3) in an initial placement or arrangement. Subsequently, the component compactor 107 extracts, among all of the read terminal graph data, only the terminal graph data where a direction of a vector turning from a terminal (a movement reserved terminal: for example, a terminal B) of the component (the movement reserved component: for example, a component 4) represented by the terminal graph data lies within 90° on the basis of a direction of a vector (the relative movement vector) obtained by subtracting the component movement vector datum for the selected component from the component movement target vector datum 73 for the movement reserved component. In the example being illustrated, the direction of the relative movement vector for the component 4 toward the component 3 is leftward while the direction turning from the terminal C of the component 4 to the terminal A of the component 3 is rightward which is different by 180°. Accordingly, the component compactor 107 does not extract the terminal graph datum indicative of the terminal graph connecting the terminal A with the terminal C. This is because, as illustrated in FIG. 9C, the direction turning from the terminal A of the component 3 to the terminal C of the component 4 is leftward after the component 3 is moved leftward toward the center kernel component, and then relationship between both in the initial placement or arrangement is reversed and is not maintained.

The component compactor 107 prepares or generates the terminal constraint array 75 including the component number 32 for the movement reserved component, the component number 32 for the selected component, the terminal graph number 79, the processing flag 78 indicative of "unprocessed", the interference direction 61 for the terminal graph data representing the terminal graph having the terminal graph number 79, and the relative movement limit distance 74. In this event, designation of the center kernel component by the component number 32 for the movement reserved component enables step-wise movement which allows to move the center kernel component in the direction of Y after moving the center kernel component in the direction of X. Processing turns from the step S107 back to the step S105.

Figure 11A:
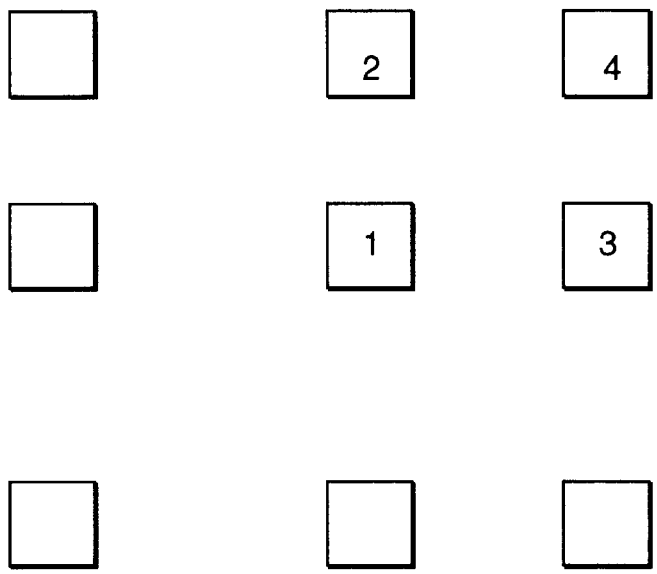
FIGS. 11A and 11B are views showing an example of compaction by a component compactor for use in the graphic layout compaction system illustrated in FIG. 3.
Figure 11B:
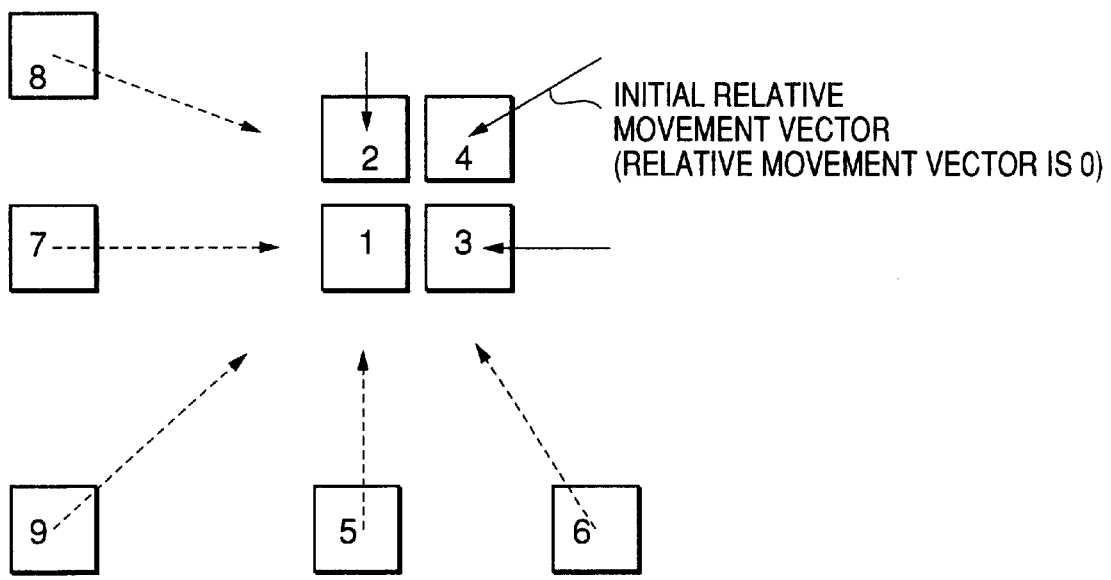

In the manner as described above, the components on the initial placement or arrangement illustrated in FIG. 11A are moved as illustrated in FIG. 11B and it is possible to move the components chainlike. Although movement of the components in a quantization direction is at a glance an obstacle to movement of the components in a direction perpendicular to the quantization direction, it is possible for the component compactor 107 to avoid the obstacle by shifting the direction of the relative movement vector indicated the relative movement vector data 84 for the components on moving the components in the direction. In addition, although both components on either side between which a particular component is put are first moved and placed or arranged in a processing process, it is possible to widen a space between the both components by making movement processing for the components by preparing the terminal constraint array 75 after the particular component is put between the both components.

In addition, although the routes (wires) 2, terminals 1, the via holes 3, and the polygonal conductor configurations 4 adjacent one another are arranged in the initial layout of the printed-circuit board with spaces therebetween violated a design rule for a minimum space, the first embodiment may be applicable. This is because the spaces less than the minimum distance defined by the design rule are corrected by the processing process.

When all of the terminal constraint arrays are processed, the step S105 is followed by a step S109 at which the component compactor 107 places or arranges each component to approach the center kernel component as much as possible by placing or arranging each component on a position where parallel movement is made by the component movement vector indicated by the component movement vector data stored in the component movement vector data memory 76.

The step S109 proceeds to a step S110 at which the rerouting (rewiring) unit 109 records the route (wire) segment number 31 stored in the terminal graph data memory 50 in rerouting (rewiring) candidate array data (not shown). The step S110 is succeeded by a step S111 at which a combination of the rerouting (rewiring) unit 109 and the routing (wiring) compactor 108 carries out rerouting (wiring) in the manner which will presently described.

First, the rerouting (rewiring) unit 109 selects one of the routes (wires) from the rerouting (rewiring) candidate array data as a processing route (wire) and extracts, from the terminal graph data memory 50, all of the terminal graph data including the wire segment numbers 31 indicative of the processing route (wire).

Subsequently, the routing (wiring) compactor 108 calculates per both component terminals represented by the extracted terminal graph data a routing (wiring) bandwidth defined by the routes (wires) between the both component terminals and prepares or generates the configuration datum 35 representative of a routing (wiring) restraint area having an octagonal shape obtained by adding the routing (wiring) bandwidth to a width in eight directions of longitudinal, lateral, and first and second diagonal for the component terminal. In a case where there is the routes (wires) whose positions are already fixed, the routing (wiring) compactor 107 handles the routes (wires) as routes (wires) having a fixed configuration and prepares or generates the configuration datum 35 representative of the routing (wiring) restraint area having the octagonal shape that includes the fixed configuration and a bundle of transformable routes (wires) freely bent around the fixed configuration. Thereafter, the routing (wiring) compactor 108 stores, in the routing (wiring) limit position data memory, a routing (wiring) limit position datum having data structure as illustrated in FIG. 7E that includes a configuration number 36, the segment number 31 for a processing route (wire), a direction 81 turning from the processing route (wire) to the component terminal in the routing (wiring) restraint area, the segment number 31 for the component terminal, and a position number 33 for the component terminal.

After the routing (wiring) compactor 108 prepares or generates the routing (wiring) limit position data related to all of the terminal graph data recording the processing segments in the manner as described above, the rerouting (rewiring) unit 109 reroutes or rewires the processing wires so as to have well-ordered configuration including oblique routing (wiring) configuration outside the routing (wiring) restraint area indicated by the routing (wiring) limit position data.

The above-mentioned processing is continued until all of the rerouting (rewiring) candidate array data are processed.

As described above, the combination of the component compactor 107 and the routing (wiring) compactor 108 compacts all of the segments and the rerouting (rewiring) unit 109 forms well-ordered oblique routes (wires).

In the manner as described above, it is possible for the first embodiment of the present invention to carry out compaction of the layout so as to gather the components around the layout area center once by dividing pro layer the via holes into the segments, by dividing per side the polygonal conductor configurations 4 into the segments, by dividing per bent point and branch point the wires 2 into the segments, by preparing the terminal graph data, and by calculating movement amounts for the components.

In the first embodiment of the present invention as described above, it is possible to make the display unit 101 display only the initial layout and a resultant layout. In addition, the graphic layout compaction system may comprise a graph data memory (not shown) for storing terminal graph data for the layout and segment data therein. In this event, the graphic layout compaction system reads the terminal graph data from the graph data memory, prepares the layout data for the components and the routes (wires) by carrying out the above-mentioned processing on the terminal graph data, and displays the resultant layout data on the display unit 101.

In addition, in the first embodiment of the present invention as described above, the graphic layout compaction system may be operable so as to calculate no configuration data 35 indicative of the relative limit movement amount octagons, to prepare the terminal graph data for recording no configuration data 35, to calculate only the initial relative movement vector data 83 extending in the movement constraint area at the step S106, and to calculates no relative movement vector data 84.

Now, referring to FIGS. 6A through 6C, description will proceed to concrete operation in the graphic layout compaction system according to the first embodiment of the present invention. FIGS. 6A through 6C are plan views showing design for use in describing the processing operation in the first embodiments. FIG. 6A shows the initial layout on the printed-circuit board as processing object in the first embodiment and the terminal graph data. FIG. 5C is the plan view showing the layout having a state where the processing according to the first embodiment comes to end.

In FIG. 6A, reference numerals of 1, 2, 3, and 4 indicate the component terminals, the routes (wires), the via holes for connecting between the layers, and the polygonal conductor configurations, respectively.

Description will proceed to operation of the compaction processing on the layout illustrated in FIG. 6A by the graphic layout compaction system according to the first embodiment of the present invention in accordance with the flow chart of the processing procedure illustrated in FIG. 4.

In FIG. 6A, the segment numbers 31 are affixed to the terminals, the route (wire) segments, the via holes by the layout data converter 111.

FIGS. 7A through 7E are views showing the data structure for the prepared segment data. FIGS. 7A shows the data structure for the segment data indicative of the terminals 1 and the via holes 3 while FIG. 7B shows the data structure for the segment data indicative of the wires 2 and the polygonal conductor configurations 4.

At the step S101 in FIG. 4, the segment data indicative of the terminals 1 record or include the component numbers 32 for all segments of the terminals related to one component while the segment data indicative of the via holes 3 record or include the component numbers 32 named each via hole for all segments of layer planes of one via hole. In addition, in the segment data for the routes (wires) 2 connected to the terminals 1 or the via holes 3, the component numbers 32 are recorded in the position data 34 when positions of ends of the wires are connected to the terminals 1 or the via holes 3. The segment data record or include the configuration numbers 36 indicative of values of coordinates and figures. For each configuration number 36 indicative of the figure, the configuration datum 35 indicative of the figure illustrated in FIG. 7D is stored. The configuration datum 35 indicative of the figure stores the configuration number 36 for the figure, a width of the figure up and down, a width of the figure left and right, a width of the figure in the first diagonal direction rotated from the lateral direction by an angle of 45° counterclockwise, and a width of the figure in the second diagonal direction rotated from the lateral direction by the angle of 45° clockwise. In the manner as described above, the figure is comprehended as the octagonal configuration.

In addition, the segment datum indicative of the polygonal conductor configuration 4 is stored in the data structure illustrated in FIG. 7B in the similar manner as the segment datum indicative of the wire 2 by dealing with each part of the polygonal conductor configuration 4 as a line segment and by dealing with the line segment as the segment.

The step S101 is followed by the step S102 at which the constraint graph generator 103 prepares or generates the constraint data having the data structure illustrated in FIG. 7F that record or include the segment numbers 31 for the segments upward in the direction of Y, the segment numbers 31 for the segments downward in the direction of Y by searching per layer plane the segments overlapped each other in the direction of Y. In FIG. 6A, the constraint graph datum is prepared or generated for the constraint graph connecting the terminal segment 1a and the terminal segment 1b. In addition, the constraint graph datum is prepared or generated for the constraint graph connecting the route (wire) segment 2a and the terminal segment 1c while the constraint graph data is prepared or generated for the constraint graph connecting the wire segment 2a and the route (wire) segment 2b. In addition, as the tail end of the constraint graph data, the boundary line X of the lowest end in the arrangement area for the segments is recorded. The boundary line X represents, for example, an edge end portion of the printed-circuit board.

The step S102 is succeeded by the step S103 at which the terminal graph generator 104 prepares or generates the terminal graph data indicative of the terminal graphs for connecting the component terminals adjacent to one another as illustrated in FIG. 6A.

Subsequently, the component compactor 107 carries out compaction arrangement by shifting the components towards a group of the center kernel components in the direction of X or the direction of Y in the order of lengthening the relative movement limit distance 74 in the direction of X or the direction of Y each component terminal as illustrated in FIG. 6B. In a case of moving the components by this compaction, when movement of the components allows moving the components by more distance by shifting the movement direction in the direction of X or the direction of Y step by step, the component compactor 107 calculates this direction on the basis of relationship between the relative limit movement amount octagon and the component movement vector data and shift the movement direction into this direction (step S106). After movement of the components, the component compactor 107 calculates an interference relationship of the segment both side represented by the terminal graph datum indicative of the terminal graph for connecting the component terminals with each other, and stores a datum indicative of the interference relationship as the terminal constraint array 75 in the terminal constraint array memory (step S107). FIG. 6B illustrates a routing (wiring) image but at this step concrete placement or arrangement position for the routing (wiring) is still not fixed.

Finally, the routing (wiring) compactor 108 prepares or generates the routing (wiring) limit position data indicative of the routing (wiring) limit positions for closely placing or arranging the routes (wires) 2 by bending the routes (wires) along configuration of the terminals center kernel side and the rerouting (rewiring) unit 109 reroutes or rewires the processing route (wire) in well-ordered configuration including the oblique routing (wiring) configuration outside the routing (wiring )restrict area indicated by the routing (wiring) limit position data (step S111). This result is illustrated in FIG. 6C.

Now, the description will proceed to main merits of the graphic layout compaction system according to the first embodiment of the present invention.

As described above, inasmuch as the components may be moved in the direction to be moved toward the group of the center kernel components in the direction of X or the direction of Y by slightly inclining from the direction of X or the direction of Y, it is possible to resolve the conventional problem where an initial result of compaction in the direction of X or the direction of Y results in an obstacle of compaction in a direction perpendicular thereto. In addition, it is possible to carry out compaction corresponding to the layout having the oblique wires by compaction once.

Description will proceed to reason for enable to efficiently compact the components toward the center of the substrate once and to correspond the oblique reroutes (wires). That is, the graphic layout compaction system first prepares or generates the terminal graph datum indicative of the terminal graph having the component terminals (except for the wires) as the nodes. Subsequently, the graphic layout compaction system calculates a movement amount by which the node of the terminal graph indicated by the terminal graph datum approaches another node of the terminal graph as a movement limit area allowing to approach in the longitudinal, the lateral, and the first and the second diagonal directions in consideration of a routing (wiring) band obtained by adding a necessary space to a width of the routes (wires) put between the segments of the both node of the terminal graph indicated by the terminal graph datum. And then, the graphic layout compaction system calculates a movement direction of the component so as to avoid the routing (wiring) band.

Figure 12:
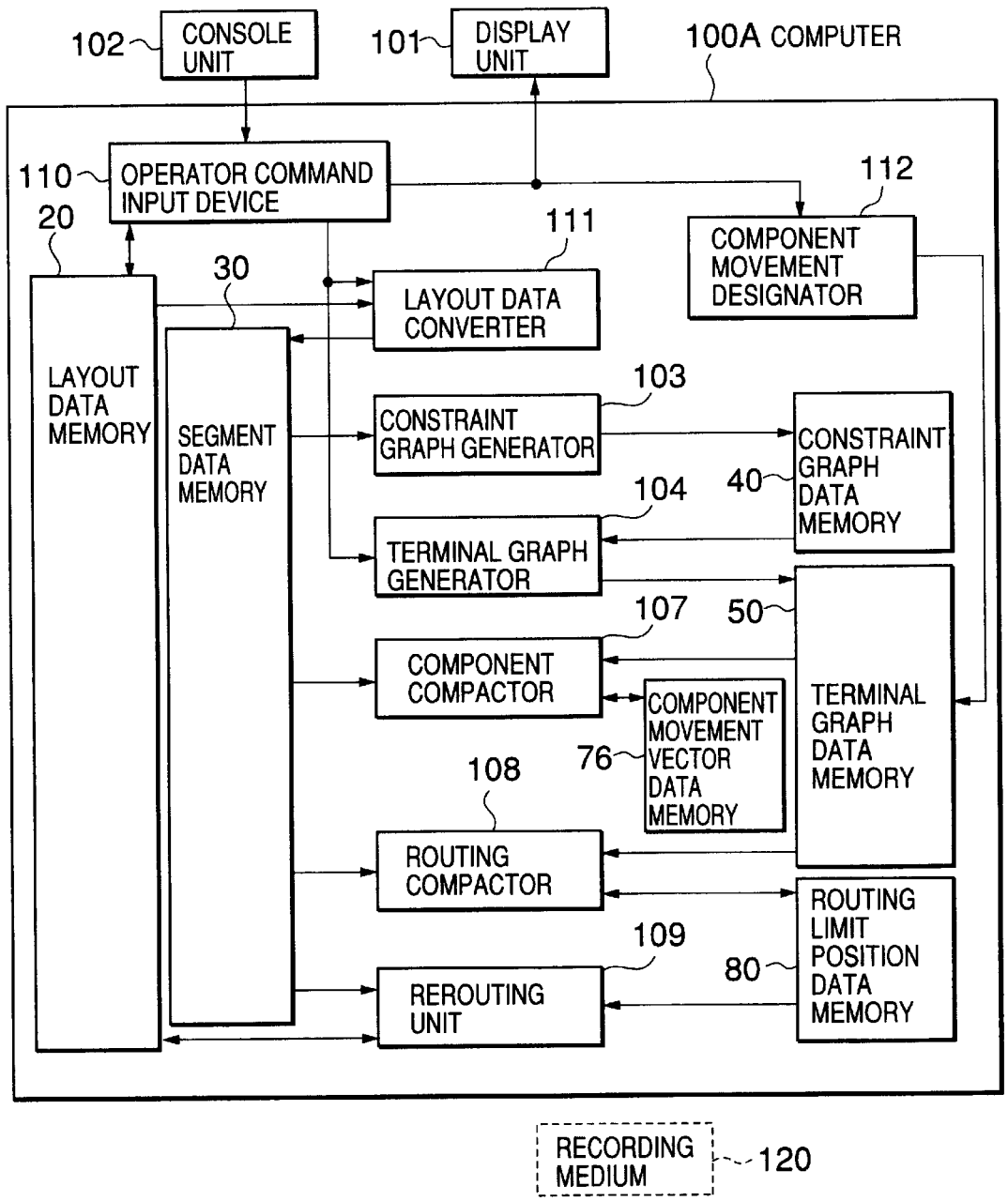
FIG. 12 is a block diagram of a graphic layout compaction system according to second and fourth embodiments of this invention.

Referring to FIG. 12, the description will proceed to a graphic layout compaction system according to a second embodiment of the present invention. The graphic layout compaction system is similar in structure and operation to that illustrated in FIG. 3 except that the computer is modified from that illustrated in FIG. 3 as will later become clear. The computer is therefore depicted at 100A.

The illustrated computer 100A is similar in structure and operation to the computer 100 illustrated in FIG. 3 except that the computer 100A further comprises a component movement designator 112. The component movement designator 112 sets the component movement target vector data 73 for designating the movement directions for the respective components toward any positions on the layout.

Figure 13:
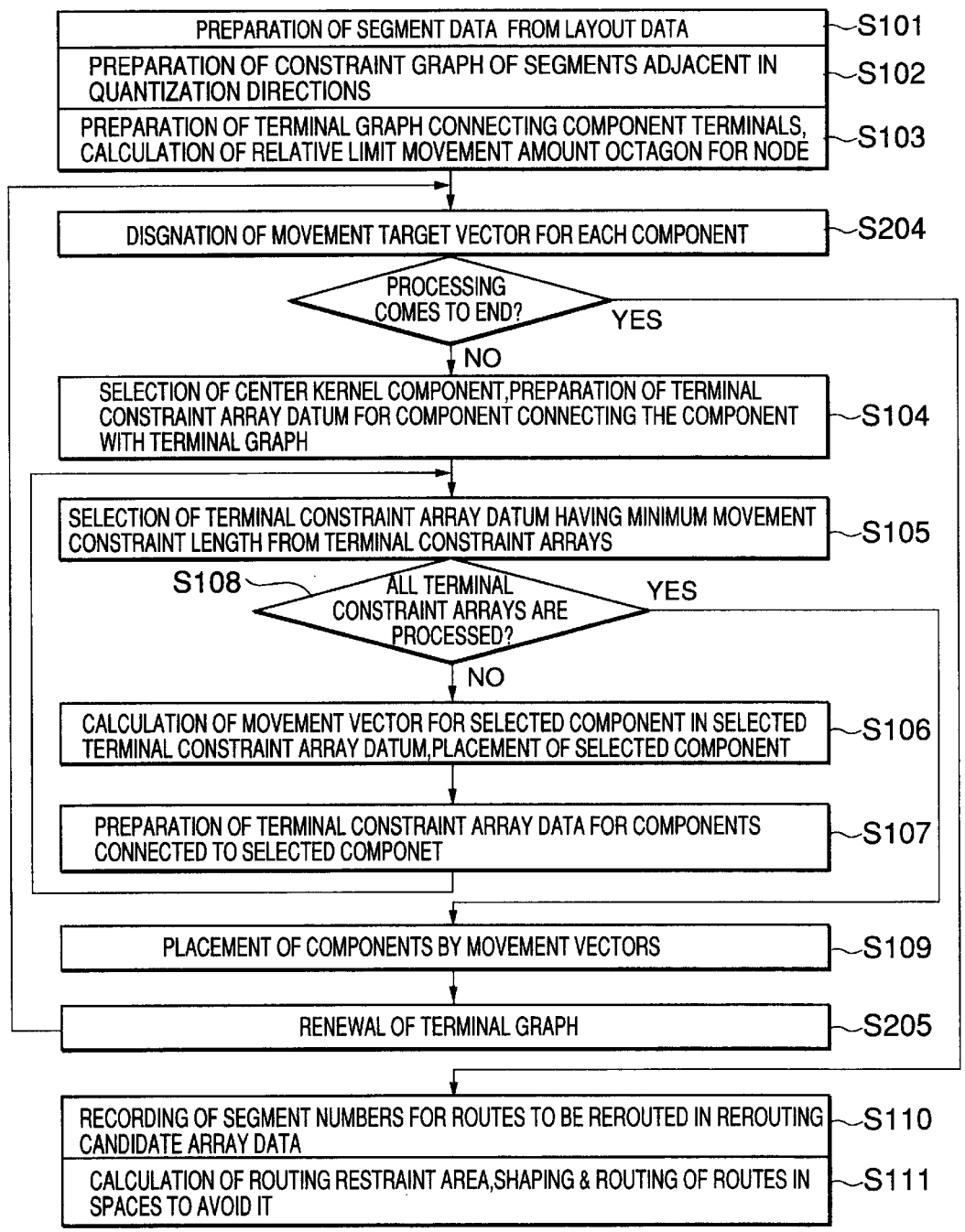
FIG. 13 is a flow chart for describing an entire operation of the graphic layout compaction system illustrated in FIG. 12.

Referring to FIGS. 13 and 5 in addition to FIG. 12, the description will proceed to entire operation of the graphic layout compaction system according to the second embodiment in detail.

First, at the step S101, the layout data converter 111 prepares or generates the segment data on the basis of the layout data in the similar manner in conjunction with the step S101 in FIG. 4 related to the first embodiment.

The step S101 is followed by the step S102 at which the constraint graph generator 103 prepares or generates the constraint data in the similar manner in conjunction with the step S102 of FIG. 4 related to the first embodiment.

The step S102 proceeds to the step S103 at which the terminal graph generator 104 calculates the terminal graph data in the similar manner in conjunction with the step S103 of FIG. 4 related to the first embodiment.

The step S103 is succeeded by a step S204 at which the component movement designator 112 sets the component movement target vector datum 73 for each component toward the movement target position 730 for any position on the layout in the manner which will presently described.

It is possible for the operator command input device 110 to designate the component movement target vector indicated by the component movement target vector datum 73 for each component on a screen of the display unit 101 by receiving the command from the console unit 102 in the operator command input device 110. In addition, it is possible to read a group of the component movement target vector data 73 for a plurality of components through a communication channel or a magnetic recording medium.

In addition, the component movement designator 112 carries out designation for inserting new routes (wires), new via holes, or new components in the layout to prepare or generate the segment data for inserted segments. In a case of inserting the route (wire), the component movement designator 112 adds the segment for the route (wire) to the terminal graph datum. In a case of inserting the via hole or the component terminal, the terminal graph generator 104 prepares or generates the terminal graph datum indicative of the terminal graph for connecting the segment indicated by the segment datum with adjacent component terminals in the manner in conjunction with the step S103 of FIG. 4 related to the first embodiment. In processing after this, components interfering the inserted segments are moved in component compaction processing so as to secure an area satisfying a width of the segment and a necessary space for a position of the segment such as routes (wires).

Furthermore, the component movement designator 112 may collectively set the component movement target vector data 73 for all of the components so as to converge the component layout in a movement direction for all of the components toward an any layout positions or so as to enlarge the component layout in the opposite direction to the movement direction. After the component compaction processing which will later be described comes to end by this indication, the step S204 proceeds to the step S110 in response to indication by an automatic operation or the operator.

When the component compaction processing does not come to end, the step S204 is followed by the step S104 at which the component movement designator 112 selects, as a center kernel component, one of the components that has a minimum component movement target vector indicated by the component movement target vector datum 73. Subsequently, in the similar manner in conjunction with the step S104 of FIG. 4 related to the first embodiment, the component movement designator 112 reads, from the terminal graph data memory 50, all of the terminal graph data indicative of the terminal graphs for connecting all of the terminals of the center kernel component to store the read terminal graph data as the terminal constraint arrays 75 in the terminal constraint array memory.

Subsequently, the component compactor 107 calculates the component movement vector data in the manner which will presently be described.

First, at the step S105, in the similar manner in conjunction with the step S105 of FIG. 4 related to the first embodiment, the component compactor 107 selects, from the terminal constraint arrays 75 each having the processing flag 78 indicative of "unprocessed", the terminal constraint array 75 having a minimum relative movement limit distance 74 as a selected terminal constraint array 75 and records "processed" in the processing flag 78 of the selected terminal constraint array 75.

The step S105 proceeds to the step S106 at which, in the similar manner in conjunction with the step S106 of FIG. 4 related to the first embodiment, the component compactor 107 selects, as a selected component, the component having the component number 32 of the selected terminal constraint array 75, calculates the component movement vector datum for the selected component, and stores the component movement vector datum in the component movement vector data memory 76.

The step S106 is succeeded by the step S107 at which, in the similar manner in conjunction with the step S107 of FIG. 4 related to the first embodiment, the component compactor 107 includes the selected component in the group of the center kernel components, records, in the terminal constraint array memory, the terminal constraint array 75 including a movement reserved component to be gathered around the group of the center kernel components and a movement direction thereof, and reserves the movement reserved component.

Until data (the terminal constraint arrays) to be processed are lost in the terminal constraint array memory, processing from the steps S105 to S107 is continued (step S108).

In the manner as described above, the components are moved in the order in which movement influences chainlike.

When all of the terminal constraint arrays are processed, the step S108 proceeds to the step S109 at which the component compactor 107 places or arranges each component to most approach the group of the center kernel components by placing or arranging each component so as to shift each component to a position to which each component moves in parallel by the component movement vector indicated by the component movement vector datum.

The step S109 proceeds to a step S205 at which the terminal graph generator 104 renews the terminal graph data indicative of the terminal graphs so as to fit the positions of the components after moved in the manner which will presently be described. Specifically, the terminal graph generator 104 reads, from the segment data memory 30, all of the segment data indicative of all of the component terminals among the segments in the order from the left end of the substrate to the right end of the substrate and prepares new terminal graph data for combinations of the component terminals (including the via holes) in accordance with the terminal graph preparing procedure (the steps S411–S414 in FIG. 5).

Herein, it is assumed that the route (wire) having the route (wire) segment number 31 recorded in the new terminal graph datum has both terminals which called terminals A and B. In this event, the terminal graph generator 104 searches a route of the terminal graph indicted by the terminal graph datum before the terminals A and B are connected to extract the route (wire) segment number 31 recorded in the terminal graph datum indicative of the terminal graph having the route. When one side position numbers 33 in those wire segment data are shared with only successive adjacent route (wire) segments (adjacent segments), the terminal graph generator 104 removes these segment numbers 31 and stores remaining route (wire) segment numbers 31 in the terminal graph data memory 50 as the route (wire) segment numbers 31 for the wires which are put between the terminals A and B of the terminal graph indicated by the terminal graph datum. In addition, the terminal graph generator 104 calculates the route (wire) bandwidth for the terminal graph indicted by the terminal graph datum and stores the route (wire) band bandwidth in the terminal graph data memory 50. Processing is turned from the step S205 back to the step S204 at which the component movement designator 112 waits indication from the operator.

When processing comes to end, the step S204 turns to the steps S110 and S111 at which, in the similar manner in conjunction with the steps S110 and S111 of FIG. 4 related to the first embodiment, the combination of the routing (wiring) compactor 108 and the rerouting (rewiring) unit 109 reroutes or rewires the routes (wires) including the well-ordered oblique routes (wires).

Figure 14A:
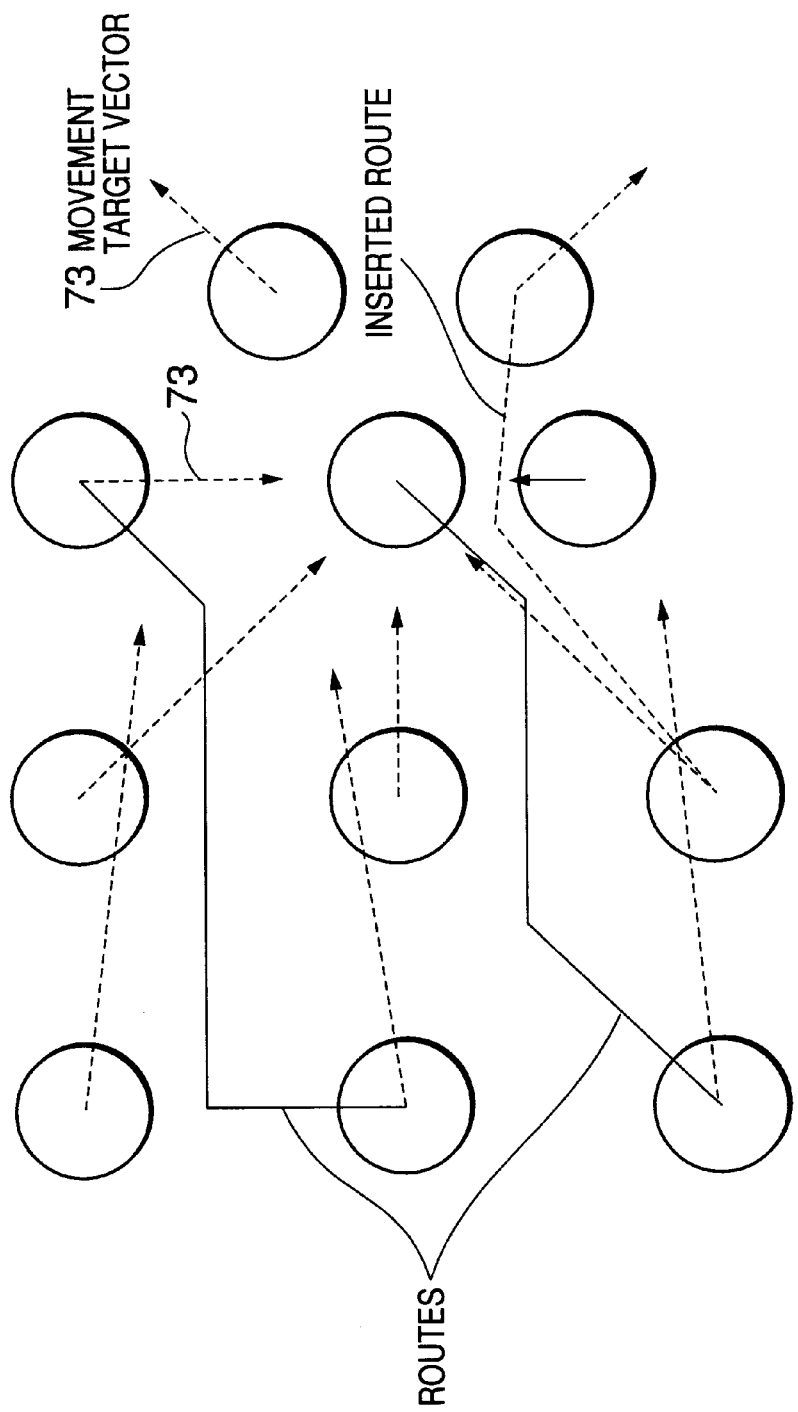
FIGS. 14A through 14C are views showing layouts for use in describing a concrete operation of the graphic layout compaction system illustrated in FIG. 13.
Figures 14B, 14C:
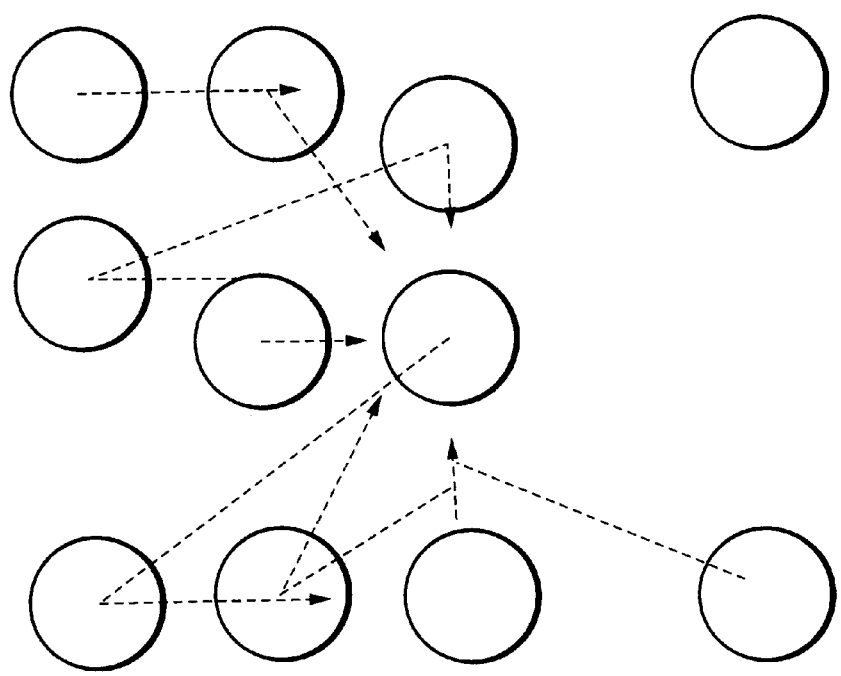

Referring now to FIGS. 14A through 14C in addition to FIGS. 12 and 13, description will proceed to concrete operation of the graphic layout compaction system according to the second embodiment of the present invention. FIGS. 14A through 14C are plan views showing design for use in describing processing operation of the second embodiment. FIG. 14A shows an initial layout of a printed-circuit board as a processing object of the second embodiment and the component movement target vectors indicated by the component movement target vector data 73. In addition, FIG. 14C is the plan view showing a layout having a state where processing according to the second embodiment comes to end.

Now, description will proceed to operation in a case where the graphic layout compaction system according to the second embodiment of the present invention carries out compaction processing on the layout illustrated in FIG. 14A.

Responsive to the command from the operator, the component movement designator 112 designates the component movement target vector datum 73 indicative of the component movement target vector for each component as illustrated in FIG. 14A. In addition, the component movement designator 112 designates a newly inserted route (wire) (the step S204).

Subsequently, in the manner as illustrated in FIG. 14B, the component compactor 107 carries out compaction placement or arrangement to move the components by the component movement vectors indicated by the component movement vector data in the order of lengthening the relative movement limit distance 74 for each component terminal in the direction of X or the direction of Y. On moving the components, the component compactor 107 shifts the movement direction in a case where the components may be moved longer distance by shifting the movement direction of the components step by step.

Subsequently, the component compactor 107 moves the components and stores the terminal constraint arrays 75 having the terminal graph numbers for the terminal graphs for connecting the component terminals in the terminal constraint array memory. Although FIG. 14B shows or displays the routing (wiring) image, concrete positions for the routes (wires) are not yet fixed in this stage.

Finally, the routing (wiring) compactor 108 prepares or generates the routing (wiring) limit position data for closely placing or arranging the routes (wires) 2 to bend the routes (wires) along the configuration of the center kernel component terminal and the rerouting (rewiring) unit 109 reroutes (rewires) the processing route (wire) in the well-ordered configuration including the oblique routing (wiring) configuration outside the routing (wiring) restraint area indicated by the routing (wiring) limit position datum (the step S111). This result is illustrated in FIG. 14C.

Now, description will proceed to main merits in the graphic layout compaction system according to the second embodiment of the present invention.

As described above, the graphic layout compaction system according to the second embodiment of the present invention carries out compaction of the layout so as to enable to move the components to any positions and for example to allow to enlarge the component layout. This is because the graphic layout compaction system according to the second embodiment of the present invention comprises the component movement designator 112 for designating the movement direction for each component as the component movement target vector datum 73 and the component compactor 107 for moving each component toward the movement target position 730 designated by the component movement target vector datum 73.

Figure 15:
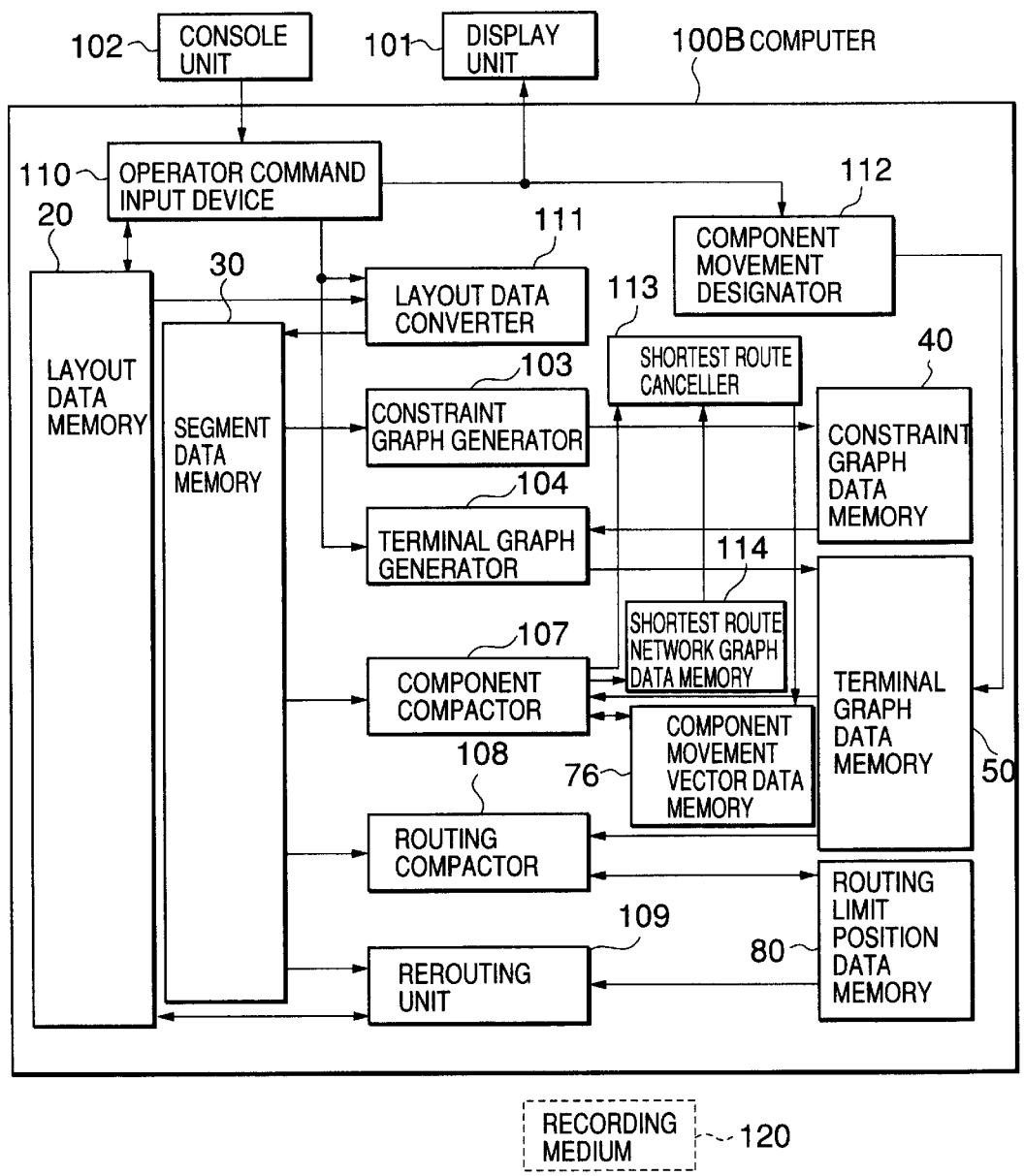
FIG. 15 is a block diagram of a graphic layout compaction system according to a third embodiment of this invention.

Referring to FIG. 15, the description will proceed to a graphic layout compaction system according to a third embodiment of the present invention. The graphic layout compaction system is similar in structure and operation to that illustrated in FIG. 12 except that the computer is modified from that illustrated in FIG. 12 as will later become clear. The computer is therefore depicted at 100B.

The illustrated computer 100B is similar in structure and operation to the computer 100A illustrated in FIG. 12 except that the computer 100B further comprises a shortest route canceller 113 and a shortest route network graph data memory 114. After the component compactor 107 calculates a shortest route network for the component terminals, the shortest route canceller 113 cancels the shortest route network by moving the via holes in the shortest route network in a direction so as to cancel the shortest route network thereby removing obstacles by the compaction.

Figure 16:
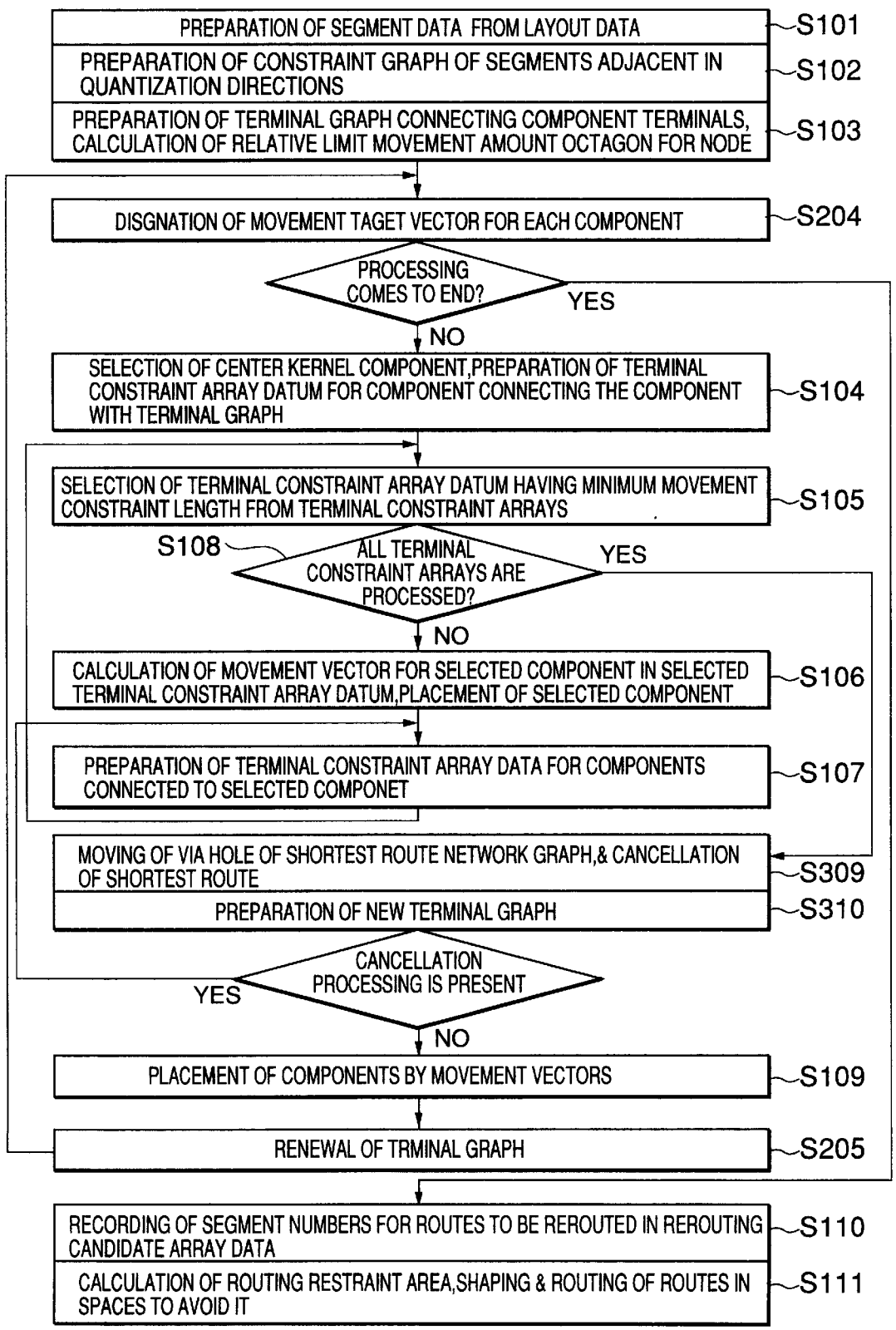
FIG. 16 is a flow chart for describing an entire operation of the graphic layout compaction system illustrated in FIG. 15.

Referring to FIGS. 16 and 5 in addition to FIG. 15, the description will proceed to entire operation of the graphic layout compaction system according to the third embodiment in detail.

First, at the step S101, the layout data converter 111 prepares or generates the segment data on the basis of the layout data in the similar manner in conjunction with the step S101 in FIG. 4 related to the first embodiment.

The step S101 is followed by the step S102 at which the constraint graph generator 103 prepares or generates the constraint data in the similar manner in conjunction with the step S102 of FIG. 4 related to the first embodiment.

The step S102 proceeds to the step S103 at which the terminal graph generator 104 calculates the terminal graph data in the similar manner in conjunction with the stop S103 of FIG. 4 related to the first embodiment.

The step S103 is succeeded by the step S204 at which the component movement designator 112 sets the component movement target vector datum 73 for each component toward the movement target position 730 for any position on the layout in the similar manner in conjunction with the step S204 of FIG. 13 related to the second embodiment.

When the component compaction processing does not come to end, the step S204 is followed by the step S104 at which the component movement designator 112 selects, as the center kernel component, one of the components that has a minimum component movement target vector indicated by the component movement target vector datum 73. Subsequently, in the similar manner in conjunction with the step S104 of FIG. 4 related to the first embodiment, the operator command input device 110 reads, from the terminal graph data memory 50, all of the terminal graph data indicative of the terminal graphs for connecting all of the terminals of the center kernel component to store the read terminal graph data as the terminal constraint arrays 75 in the terminal constraint array memory.

Subsequently, the component compactor 107 calculates the component movement vector data in the manner which will presently be described.

First, at the step S105, the component compactor 107 selects, from the terminal constraint arrays 75 each having the processing flag 78 indicative of "unprocessed" read out of the terminal constraint array memory, the terminal constraint array 75 having a minimum relative movement limit distance 74 as a selected terminal constraint array 75, reads the terminal graph datum including the minimum relative movement limit distance 74 out of the terminal graph data memory 50, records "processed" in the processing flag 78 of the selected terminal constraint array 75, records the read terminal graph datum in the shortest route network graph data memory 55 as a shortest route network graph datum 57 having data structure illustrated in FIG. 17, and records the component numbers 32 for both ends and interference direction 61 in the shortest route network graph data memory 114. When the shortest route network graph data memory 114 already stores the shortest route network graph datum 55 including the same interference direction 61 and the same component numbers for the both ends therein, the component compactor 107 renews the shortest route network graph datum 55 in a case where the relative movement limit distance 74 becomes shorter.

The step 8105 proceeds to the step 8106 at which, in the similar manner in conjunction with the step 8106 of FIG. 4 related to the first embodiment, the component compactor 107 selects, as a selected component, the component having the component number 32 of the selected terminal constraint array 75, calculates the component movement vector datum for the selected component, and stores the component movement vector datum in the component movement vector data memory 76.

The step S106 is succeeded by the step S107 at which, in the similar manner in conjunction with the step S107 of FIG. 4 related to the first embodiment, the component compactor 107 includes the selected component in the group of the center kernel components, records, in the terminal constraint array memory, the terminal constraint array 75 including a movement reserved component to be gathered around the group of the center kernel components and a movement direction thereof, and reserves the movement reserved component.

Until data (the terminal constraint arrays) to be processed are lost in the terminal constraint array memory, processing from the steps S105 to S107 is continued (step S108).

In the manner as described above, the component compactor 107 calculates the component movement vector data for moving the components in the order in which movement influences chainlike.

When all of the terminal constraint arrays are processed, the step S108 proceeds to a step S309 at which the shortest route canceller 113 extracts the via holes of nodes indicated by the shortest route network graph datum 55 that is put between two shortest route network graph data which have the common interference direction 61. In this event, the component terminal having the terminal graph number 79 recorded in the shortest route network graph datum 55 may be displayed on the display unit 101 in order to carry out display of the shortest route and the operator command input device 110 may wait for indication from the operator.

Subsequently, the shortest route canceller 113 places or arranges, on the basis of the terminal graph datum having the terminal graph number 79 recorded in the shortest route network graph datum 55, the relative limit movement amount octagon in a movement position for the component terminal of another node (a shortest route node) connected to the via hole and places or arranges the relative limit movement amount octagon in another movement position for the component terminal of the other node (the shortest route node) indicated by another terminal graph datum. Thereafter, the shortest route canceller 113 moves the node of the via hole between a octagonal column of the shortest route node in a perpendicular direction, calculates the component movement vector datum indicative of the component movement vector apart from a space between those relative limit movement amount octagons, and stores it in the component movement vector data memory 76. In addition, the shortest route canceller 113 renews the component movement target vector data 73 into the component movement vector data. By movement of the via hole, the shortest route is cancelled.

The step S309 is followed by a step S310 at which the terminal graph generator 104 prepares or generates a terminal graph datum indicative of a terminal graph connected to the via hole. Specifically, the terminal graph generator 104 regards each terminal of the via hole as a terminal A, regards, as a terminal B, a component terminal connected to the terminal graph indicated by the terminal graph data with the component terminal connected to the terminal A via the terminal graph indicated by the existing terminal graph datum, and prepares or generates the terminal graph data in accordance with the terminal graph preparing procedure (steps S411–S414 in FIG. 5). In addition, the terminal graph generator 104 renews a direction of the graph for the existing terminal graph datum. Furthermore, the terminal graph generator 104 regards a first shortest route node as the terminal A, regards a second shortest route node as the terminal B, and prepares or generates the terminal graph data in accordance with the terminal graph preparing procedure in the similar manner.

The terminal graph generator 104 extracts, as the wire segment number 31 recorded in a newly prepared terminal graph datum, the route (wire) segment number 31 recorded in the terminal graph datum indicative of a route which is obtained by searching the route by the terminal graph indicated by the existing terminal graph datum for connecting the terminals A and B. When one position number 33 in those route (wire) segment data is shared with only successive adjacent route (wire) segments (adjacent segments), the terminal graph generator 104 removes those segment numbers 31 and stores, in the terminal graph data memory 50, new terminal graph data having, as the remaining wire segment numbers 31, the route (wire) segment numbers 31 which are put between the both ends of the terminal graph indicated by the terminal graph datum for the terminals A and B. In addition, the terminal graph generator 104 calculates the route (wire) bandwidth for the routes (wires) and stores the new terminal graph datum including the route (wire) bandwidth in the terminal graph data memory 50.

When there is a cancellation processing, the terminal graph generator 104 carries out processing in the step S107 by selecting the via hole and the components of the shortest route node as the selected component and thereafter carries out processing after the step S105.

In the manner as described above, the components are moved in the order in which the movement of the components influences chainlike.

It will be assumed that a group of the components chained by the compaction is separated into several independent subgroups. In this event, there is remaining subgroups of the components that are not processed in the above-mentioned processing. Under the circumstances, processing of the steps S104–S108 is carried out for the remaining subgroups of the components (the step S205).

When there is no cancellation processing, the step S310 is succeeded by the step S109 at which the component compactor 107 places or arranges each component to a position to which each component moves in parallel by the component movement vector indicated by the component movement vector datum stored in the component movement vector data memory 76.

Finally, in the similar manner in conjunction with the steps S110 and S111 of FIG. 4 related to the first embodiment, the combination of the routing (wiring) compactor 108 and the rerouting (rewiring) unit 109 reroutes or rewires the routes (wires) including the well-ordered oblique routes (wires) (steps S110 and S111).

Figure 18A:
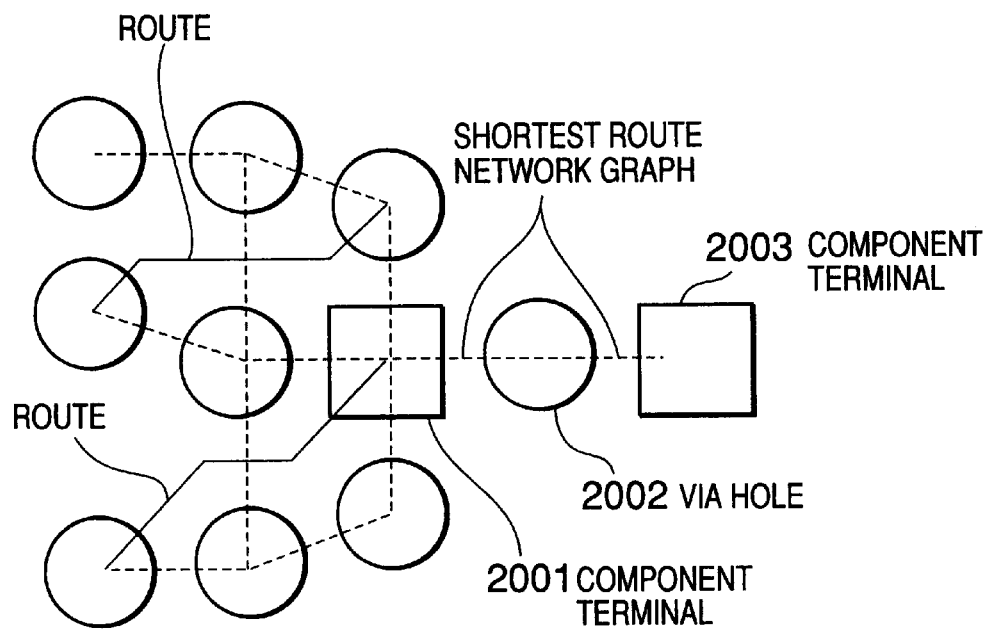
FIGS. 18A through 18C are views showing layouts for use in describing a concrete operation of the graphic layout compaction system illustrated in FIG. 15.
Figure 18B:
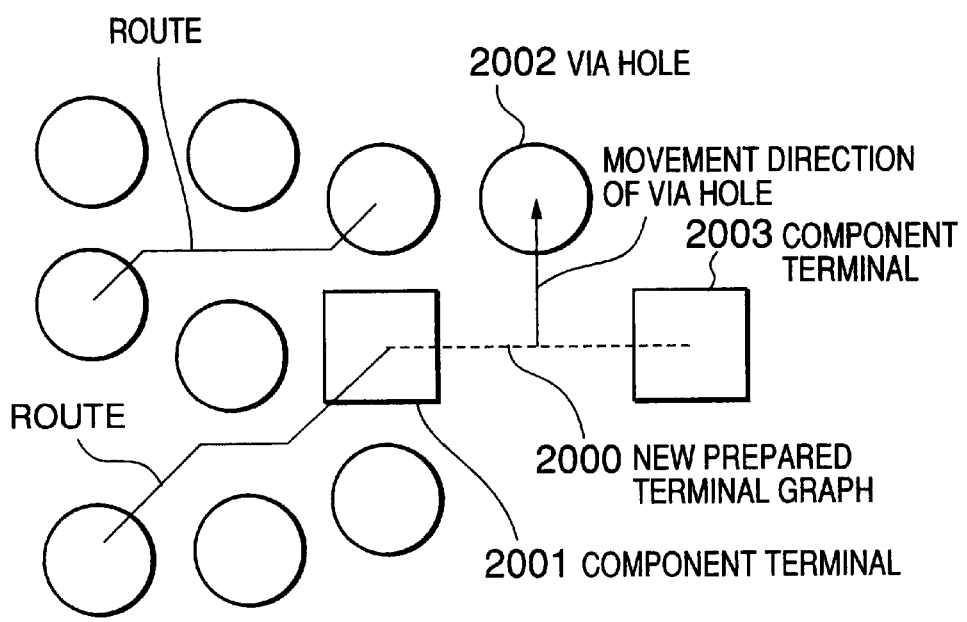
Figure 18C:
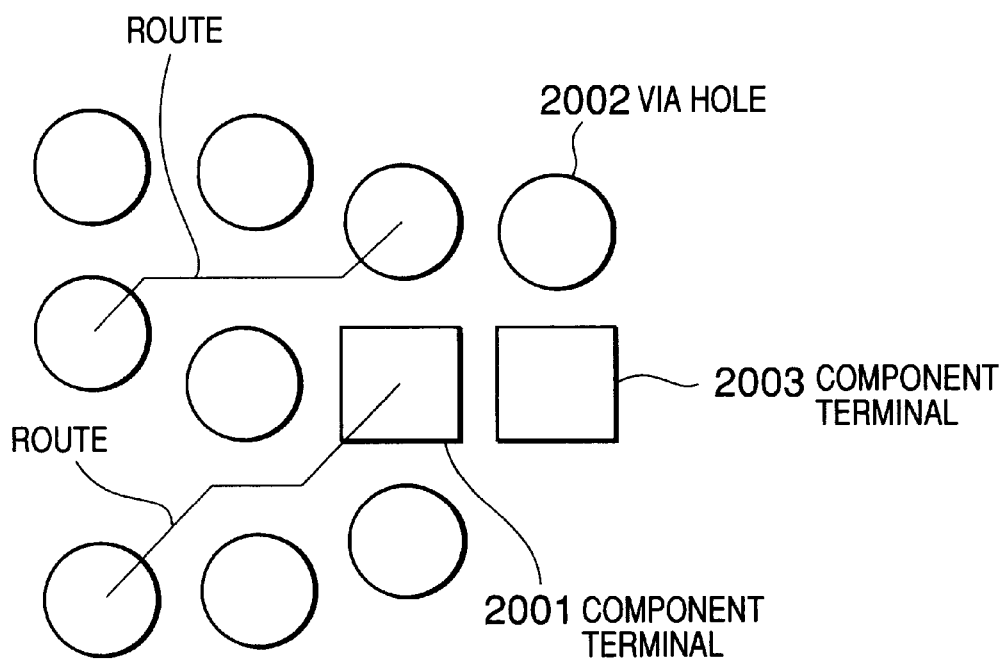

Referring now to FIGS. 18A through 18C in addition to FIGS. 15 through 17, description will proceed to concrete operation of the graphic layout compaction system according to the third embodiment of the present invention. FIGS. 18A through 18C are plan views showing design for use in describing processing operation of the third embodiment. FIG. 18A is the plan view showing a layout indicative of a processing result until the step S309 in FIG. 16 and the shortest route network graph data 55. In addition, FIG. 18C is the plan view showing a layout having a state where processing according to the third embodiment comes to end.

Now, description will proceed to operation in a case where the shortest route canceller 113 in the graphic layout compaction system according to the third embodiment of the present invention cancels the shortest route in accordance with the flow chart indicative of the processing procedure illustrated in FIG. 16.

As regards the layout illustrated in FIG. 18A, the shortest route canceller 113 extracts, from via holes of the nodes indicated by the shortest route network graph data 55, a specific via hole 2002 put between two shortest route network graphs indicated by two shortest route network graph data 55 having a common interference direction 61. Subsequently, the shortest route canceller 113 cancels the shortest route by moving the specific via hole 2002 in a direction perpendicular to a series of component terminals 2001 and 2003 corresponding to other nodes connected to the specific via hole 2002 via the two shortest route network graphs indicated by the two shortest route network graph data 55, as illustrated in FIG. 18B. In addition, the terminal graph generator 104 prepares or generates a new terminal graph datum for connecting the nodes of the shortest route.

Subsequently, the component compactor 107 selects, as selected components, the specific via hole 2002 and the component terminals 2001 and 2003, carries out processing of the step S107, and prepares or generates the terminal constraint array 75. Thereafter, the component compactor 107 carries out processing after the step S105 and moves the component terminal 2003 as illustrated in FIG. 18C.

Now, description will proceed to main merits in the graphic layout compaction system according to the third embodiment of the present invention.

As described above, the graphic layout compaction system according to the third embodiment of the present invention cancels the shortest route to automatically place or arrange the components in a smaller area by moving the via hole in the shortest route indicated by the terminal graph datum in the direction perpendicular to the interference direction 61 in the shortest route network graph indicated by the shortest route network graph datum. This is because the graphic layout compaction system according to the third embodiment of the present invention comprises the shortest route canceller 113 for detecting the shortest route indicted by the terminal graph datum and for generating or preparing the component movement vector datum indicative of the component movement vector so as to avoid the via hole through the shortest route from the shortest route.

Turning back to FIG. 12, the description will proceed to a graphic layout compaction system according to a fourth embodiment of the present invention. The graphic layout compaction system is similar in structure and operation to that illustrated in FIG. 12 except that operations in the component movement designator 112 and the component compactor 107 are different from those illustrated in FIG. 12 as will later become clear.

In the fourth embodiment of the present invention, the component movement designator 112 designates movement for all components in enlarged positions where a distance between the layout center and the position for each component is enlarged into a similar distance. In addition, the component compactor 107 places or arranges the components in the enlarged positions where the layout is enlarged and enlargedly places or arranges also initial routes (wires) between the component terminals with this.

The component compactor 107 may use the component compactor 107 used in the above-mentioned second or third embodiments.

Subsequently, the component compactor 107 routes or wires unrouted or unwired portions between the terminals of each component. Otherwise, the component compactor 107 modifies the components in the enlarged placement or arrangement or corrects the routes (wires).

Thereafter, the component movement designator 112 designates movement for a resultant layout so as to direct all components and routes (wires) to the layout center and the combination of the component compactor 107 and the routing (wiring) compactor 108 carries out compaction of the layout.

Now, description will proceed to main merits in the graphic layout compaction system according to the fourth embodiment of the present invention. The graphic layout compaction system according to the fourth embodiment of the present invention has the merits enabling to easily realize high-density routing (wiring) by carrying out the routes (wires) between the components or design modification on a sufficiently enough large space and then by compacting the components and the routes (wires). This is because the component compactor 107 of the graphic layout compaction system according to the fourth embodiment of the present invention carries out component movement so as to enlarge spaces between the components and the routes (wires).

Figure 19:
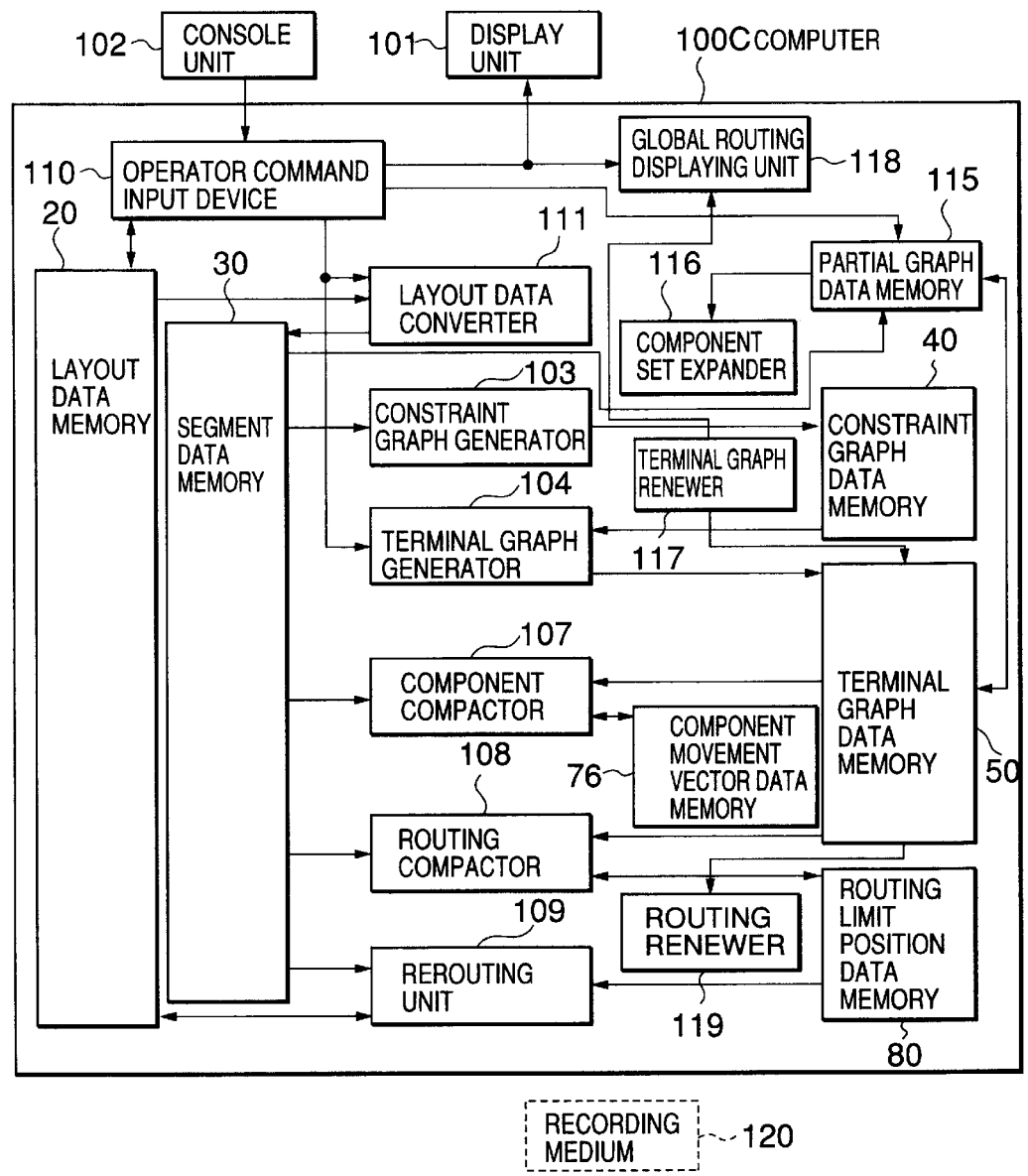
FIG. 19 is a block diagram of a graphic layout compaction system according to a fifth embodiment of this invention.

Referring to FIG. 19, the description will proceed to a graphic layout compaction system according to a fifth embodiment of the present invention. The graphic layout compaction system is similar in structure and operation to that illustrated in FIG. 3 except that the computer is modified from that illustrated in FIG. 3 as will later become clear. The computer is therefore depicted at 100C.

The illustrated computer 100C is similar in structure and operation to the computer 100 illustrated in FIG. 3 except that the computer 100C further comprises a partial graph data memory 115, a component set expander 116, a terminal graph renewer 117, a global routing (wiring) displaying unit 118, and a routing (wiring) renewer 119. These units generally operate in the manner which will presently be described.

The partial graph data memory 115 stores, therein, the segment data indicative of the components and the routes (wires) within a partial area (a broken area) in the layout and the terminal graph data. The component set expander 116 reads, from the partial graph data memory 115, the segment data and the terminal data and places or arranges the read segment data and the read terminal data. In other words, the component set expander 116 cuts off the partial area of the layout to replace the partial area by parallel movement and rotation in the manner which will later become clear. The terminal graph renewer 117 renews the terminal graph data indicative of terminal graphs for connecting the component terminals outside the broken area and the component terminals inside the broken area. In other words, the terminal graph renewer 117 renews connections between the component terminals inside the partial area and the component terminals outside the partial area in the manner which will later become clear. The global routing (wiring) displaying unit 118 displays, on the display unit 101, global positions for the routes (wires) put between the terminal graphs indicated by the terminal graph data. The routing (wiring) renewer 119 renews or switches the order of designated routes (wires), designated component terminals, and the routes (wires). In other words, the routing renewer 119 switches the order of first and second routes with each other in the manner which will later become clear.

Figure 20:
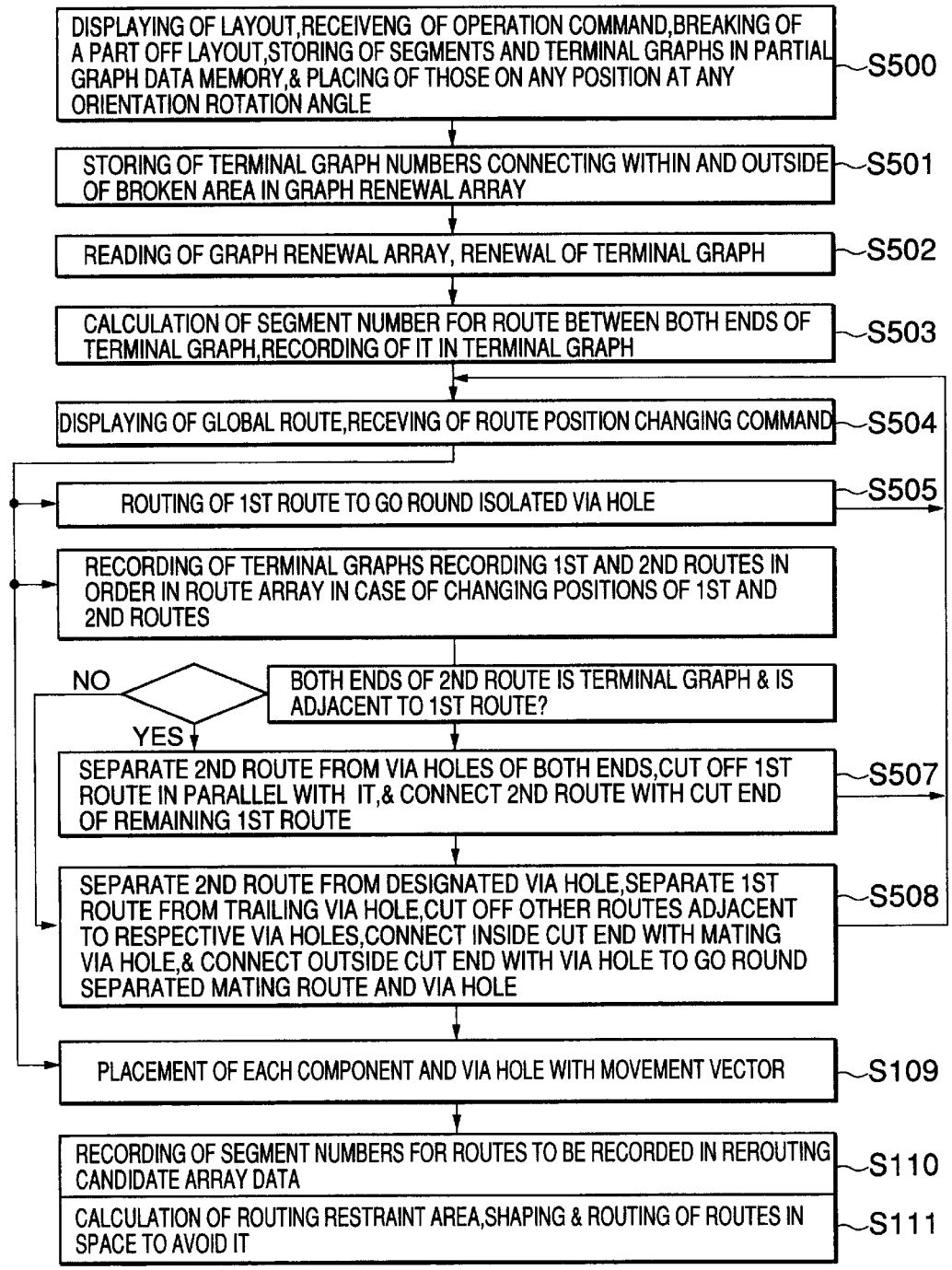
FIG. 20 is a flow chart for describing an entire operation of the graphic layout compaction system illustrated in FIG. 19.

Referring now to FIG. 20 in addition to FIG. 19, the description will proceed to operation of the graphic layout compaction system according to the fifth embodiment of the present invention.

In the fifth embodiment of the present invention, at a step S500, responsive to the command from the operator, the operator command input device 110 designates the partial area (the broken area) in the layout, prepares the segment data indicative of the components and the routes (wires) within the broken area and the terminal graph data, and stores the segment data and the terminal graph data in the partial graph data memory 115. In addition, responsive to the command from the operator via the operator command input device 110, the terminal graph expander 116 reads, from the partial graph data memory 115, the segment data and the terminal graph data on any layer plane and any expanded positions on the layout by designating any orientation rotation angle and places or arranges the segments and the terminal graphs by rotating the expanded position around a center by the orientation rotation angle (90°).

Subsequently, the terminal graph renewer 117 renews the terminal graph data indicative of the terminal graphs connecting the component terminals outside the broken area and the component terminals within the broken area in the manner which will presently be described.

Specifically, at a step S501, the terminal graph renewer 117 records, in graph renewing arrays (not shown), the terminal graph numbers 79 for the terminal graphs for connecting the component terminals within the broken area and the component terminals outside the broken area.

The step S501 is followed by a step S502 at which the terminal graph renewer 117 successively reads, from the graph renewing arrays, terminal graph data (processing graphs) having the recorded terminal graph numbers 79, regards the component terminals of one side ends as terminals A, regards, as terminals B, the component terminals connected to the component terminals of other ends via the terminal graphs indicated by the existing terminal graph data, renews the terminal graph data for the terminals A and B in accordance with the terminal graph preparing procedure (the steps S411–S414 in FIG. 5). When new terminal graph data for the terminals A and B are prepared or generated, the terminal graph renewer 117 records the terminal graph numbers 79 therefor in the graph renewing arrays.

The step S502 proceeds to a step S503 at which the terminal graph renewer 117 extracts, as the route (wire) segment numbers 32 to be recorded in newly prepared terminal graph data, the route (wire) segment numbers 31 recorded in the terminal graph data indicative of the route obtained by searching the route for connecting the terminals A and B via the terminal graphs indicated by the existing terminal graph data. When the position numbers 33 of one sides in those route (wire) segment data are shared only successive adjacent route (wire) segments (adjacent segments), the terminal graph renewer 117 removes those segment numbers 31 from the route (wire) segment data and stores, in the terminal graph data memory 50, new terminal graph data having remaining route (wire) segment numbers 31 as the route (wire) segment numbers 31 put between both ends of the terminal graphs indicated by the terminal graph data for the terminals A and B. In addition, the terminal graph renewer 117 records the new terminal graph data in the terminal graph data memory 50.

Furthermore, the terminal graph renewer 117 renews the terminal graph data for the component terminals of other ends of the processing graph by similar processing after the step S502. Subsequently, the terminal graph renewer 117 turns back to the step S502, reads the next processing graph from the graph renewing arrays, and continues processing for all of the graph renewing arrays until coming to end.

The step S503 is succeeded by a step S504 at which the global routing (wiring) displaying unit 118 displays the global routes (wires) between the component terminals on the display unit 101. Subsequently, responsive to the commend from the operator, the operator command input device 110 designates the routing (wiring) layer plane number and designates the component terminal and the global routes (wires) adjacent to the component terminal on the routing (wiring) layer plane indicated by the routing (wiring) layer plane number.

Figure 21A:
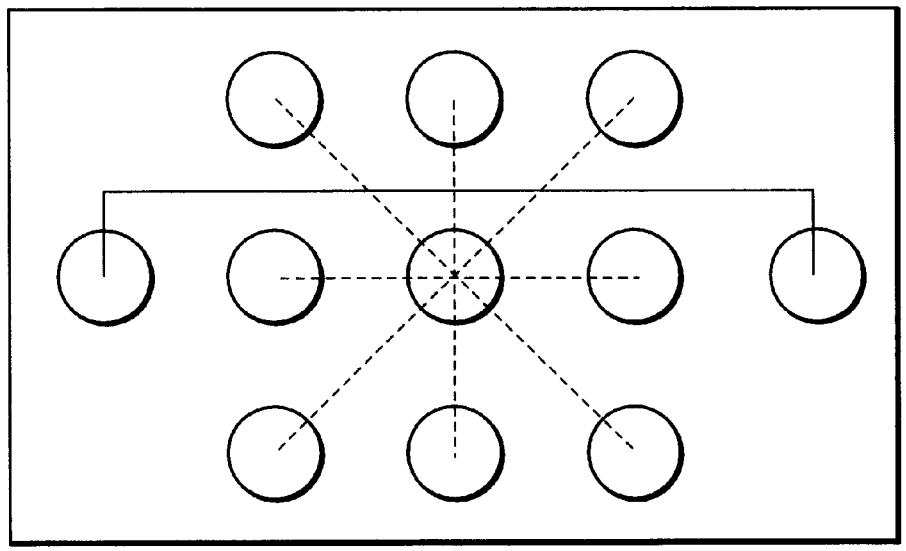
FIGS. 21A and 21B are views showing layouts for use in describing an operation of a routing renewer used in the graphic layout compaction system illustrated in FIG. 19.
Figure 21B:
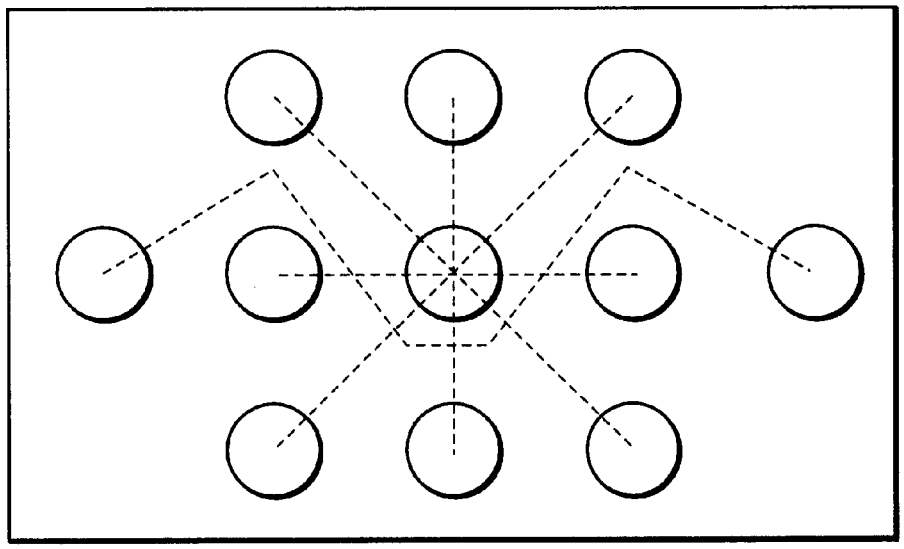

The step S504 is followed by a step S505 at which the routing (wiring) renewer 119 makes a designated global route (wire)(a first route (wire)) as illustrated in FIG. 21A go round a designated component terminal in the manner as illustrated in FIG. 21B. Specifically, the routing (wiring) renewer 119 removes the segment number 31 for the global route (wire) recorded in the terminal graph datum indicative of the terminal graph connecting the component terminal and records the segment number 31 in the terminal graph datum which does not record the segment number 31 for the global route (wire). When the same segment number 31 for the global route (wire) is recorded in two terminal graph data which are adjacent in direction to each other, the global route (wire) goes through the two terminal graphs indicated by the two terminal graph data. In the manner as described above, the global route (wire) going round the terminal component is formed.

When a second route (wire) is connected to the designated component terminal, the step S504 is followed by a step S506 at which the routing (wiring) renewer 119 changes or switches the first and the second routes (wires) with each other in the manner which will presently be described. Specifically, the routing (wiring) renewer 119 extracts the terminal graph datum having a first terminal graph number 79 that records the segment 31 of the global route (wire) (the first route (wire)) and sequentially stores, in a first array, the first terminal graph number 79 for the first terminal graph from the designated component terminal (the terminal A in FIG. 22A) to a trailing end (the terminal B) of the first route (wire). In addition, the routing (wiring) renewer 119 extracts the terminal graph datum having a second terminal graph number 79 that records the segment 31 of the second route (wire) and sequentially stores, in a second array, the second terminal graph number 79 for the second terminal graph from a leading end (the terminal A) of the second wire to a trailing end (the terminal C).

Subsequently, the routing (wiring) renewer 119 compares the fist array with the second array. It will be assumed that a leading terminal graph number 79 (a leading point graph) and a trailing terminal graph number 79 (a trailing point graph) in the second array are recorded in the first array and the route (wire) connected to the component terminal of the trailing end of the second route (wire) is the second route (wire) on the layer plane alone. In this event, the step S506 proceeds to a step S507 at which the routing (wiring) renewer 119 changes or switches the order of the first route (wire) and the second route (wire) with each other in the manner which will presently be described. Specifically, when the segment number 31 of the first routes (wire) is recorded in the terminal graph datum indicative of the terminal graph connecting the component terminals of both ends of the second route (wire), the routing (wiring) renewer 119 cancels the segment number 31. Otherwise, the routing (wiring) renewer 119 records the segment number 31 to make the first route (wire) go round. In addition, the routing (wiring) renewer 119 rewrites the segment number 31 for the first routes (wire) of the terminal graph datum recorded in the first array from the leading point graph to the trailing point graph into the segment number for the second route (wire) and rewrites the segment number 31 for the second route (wire) of the terminal graph datum recorded in the second array from the leading point graph to the trailing point graph into the segment number for the first route (wire).

Figure 22A:
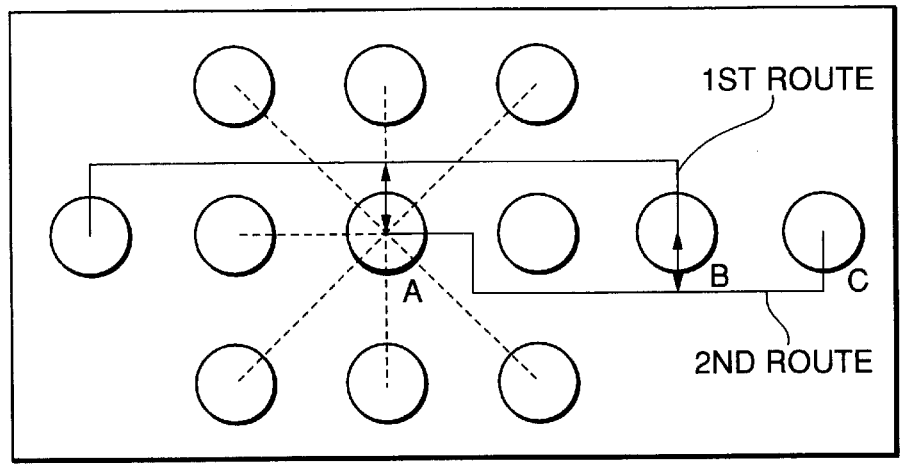
FIGS. 22A and 22B are views showing layouts for use in describing another operation of the routing renewer used in the graphic layout compaction system illustrated in FIG. 19.
Figure 22B:
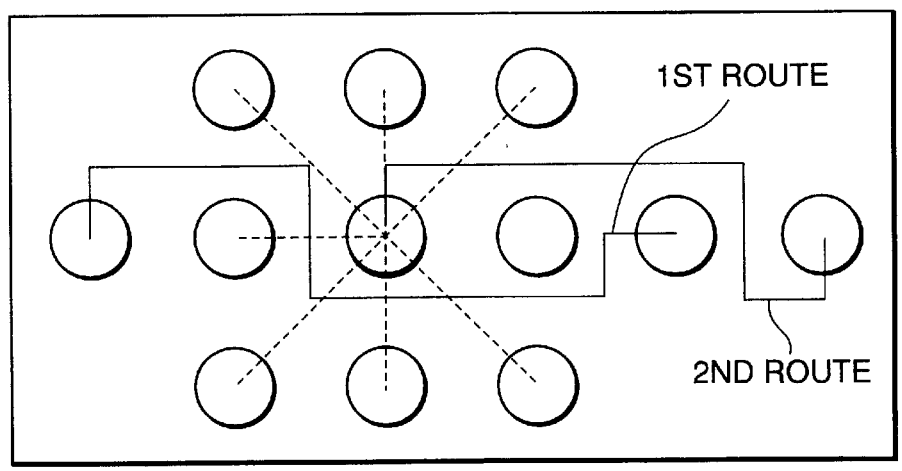

On the other hand, as illustrated in FIG. 22A, it will presumed that the leading terminal graph number 79 (the leading point graph) and the trailing terminal graph number 79 (the trailing terminal graph) in the first array are recorded in the second array. In this event, when the route (wire) connected to the component terminal of the trailing end of the first route (wire) is only the first route (wire) in this layer plane, the step S506 is succeeded to a step S508 at which the routing (wiring) renewer 119 changes or switches the order of the second route (wire) and the first route (wire) as illustrated in FIG. 22B in the manner which will presently be described.

Specifically, when the segment number 31 of the first route (wire) is recorded in the terminal graph datum indicative of the terminal graph connecting the component terminals of the leading point of the second route (wire), the routing (wiring) renewer 119 cancels the segment number 31. Otherwise, the routing (wiring) renewer 119 records the segment number 31 to make the first route (wire) go round. In addition, when the segment number 31 of the second route (wire) is recorded in the terminal graph datum indicative of the terminal graph connecting the component terminals of the trailing point of the first route (wire), the routing (wiring) renewer 119 cancels the segment number 31. Otherwise, the routing (wiring) renewer 119 records the segment number 31 to make the second route (wire) go round the trailing point of the first route (wire). In addition, the routing (wiring) renewer 119 rewrites the segment number 31 for the first route (wire) of the terminal graph datum recorded in the first array from the leading point graph to the trailing point graph into the segment number for the second route (wire) and rewrites the segment number 31 for the second route (wire) of the terminal graph datum recorded in the second array from the leading point graph to the trailing point graph into the segment number for the first route (wire).

In the manner as described above, the routing (wiring) renewer 119 changes or switches the order of the first route (wire) and the second route (wire) with each other.

Thereafter, the component compactor 107 places or arranges each component in a position which is moved in parallel by the component movement vector indicated by the component movement vector datum (the step S109).

The step S109 proceeds to the steps S110 and S111 at which, in the similar manner in conjunction with the steps S110 and S111 of FIG. 4 related to the first embodiment, the combination of the routing (wiring) compactor 108 and the rerouting (rewiring) unit 109 reroutes or rewires the routes (wires) including the well-ordered oblique routes (wires).

Figure 23A:
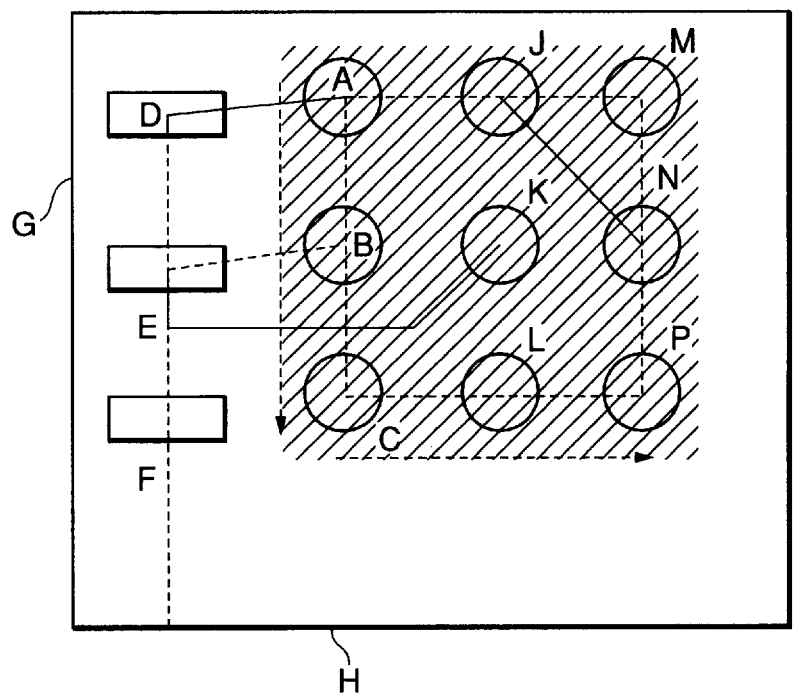
FIGS. 23A through 23D are views showing layouts for use in describing a concrete operation of the graphic layout compaction system illustrated in FIG. 19.
Figure 23B:
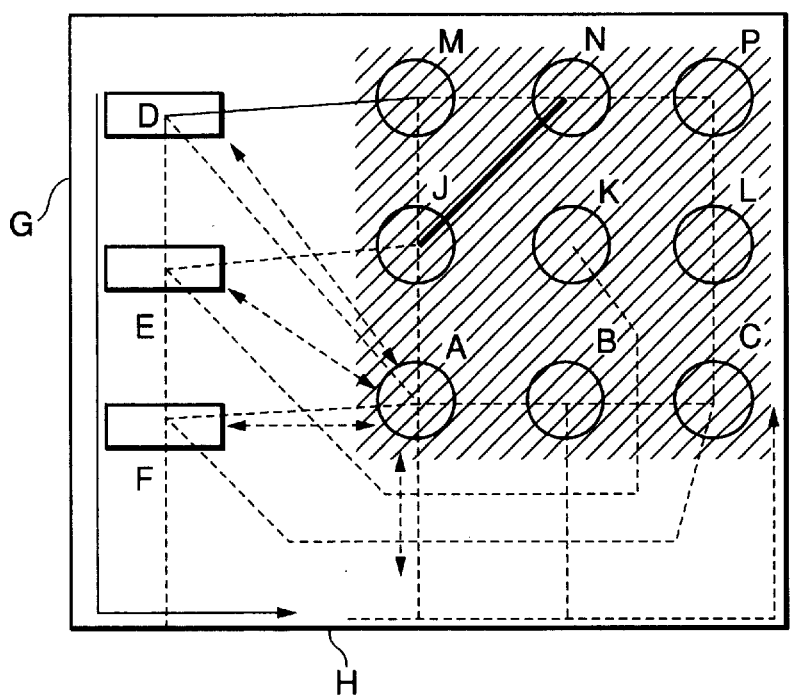

Referring to FIGS. 23A through 23B in addition to FIGS. 19 and 20, the description will proceed to operation of the graphic layout compaction system according to the fifth embodiment of the present invention.

As illustrated in FIG. 23A, the operator command input device 110 designates the broken area shown in oblique lines of FIG. 23A and prepares or generates the segment data for the components and the routes (wires) within the broken area and the terminal graph data. In addition, the operator command input device 110 designates the orientation rotation angle of 90° counterclockwise for the segment data and the terminal graph data, reads the segment data and the terminal graph data from the segment data memory 30 and the terminal graph data memory 50, respectively, and places or arranges the read segment data and the read terminal graph data in the manner as illustrated in FIG. 23B.

Subsequently, at the step S501 of FIG. 20, the terminal graph renewer 117 records, in the graph renewing array, the terminal graph data number 79 (which is hereunder abbreviated a terminal graph AD) for the component terminals A and D, a terminal graph BE, a terminal graph CF, and so on. Subsequently, at the steps S502 and S503 of FIG. 20, the terminal graph renewer 117 prepares or generates a terminal graph AE on the basis of the terminal graph AD and prepares or generates a terminal graph AF by repeating the steps S502 and S503. Likewise, the terminal graph renewer 117 prepares or generates a terminal graph BF on the basis of the terminal graph BE and subsequently prepares or generates a terminal graph BH. In addition, the terminal graph renewer 117 prepares or generates a terminal graph CH on the base of the terminal graph CF.

Figure 23C:
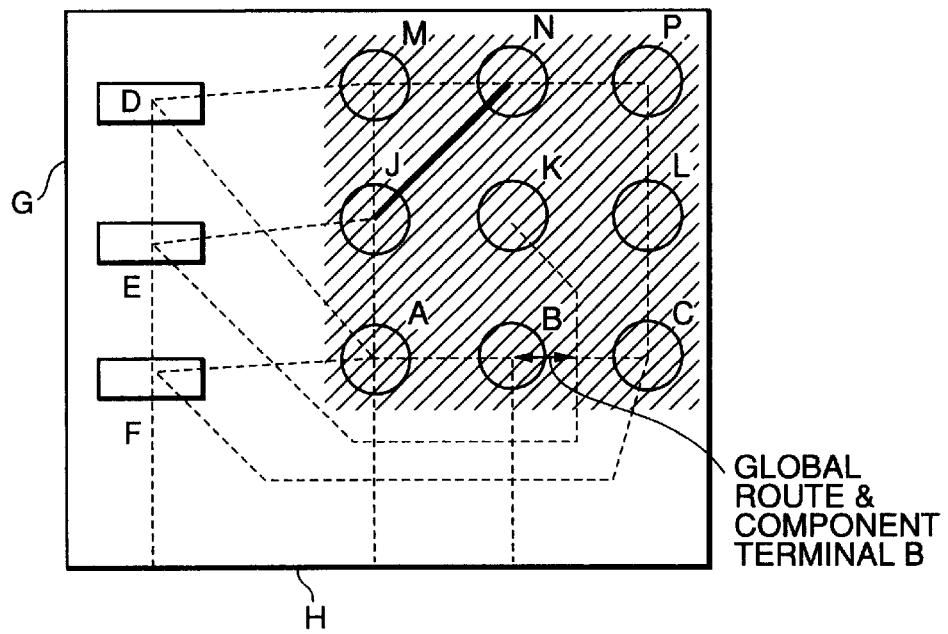
Figure 23D:
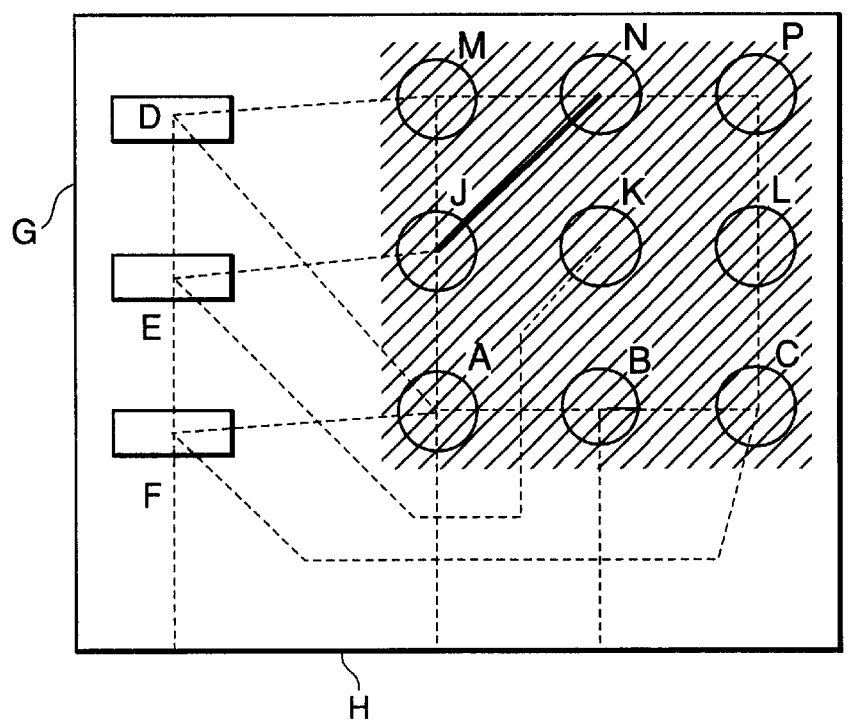

Subsequently, the global routing displaying unit 118 makes the display unit 101 display the global routes between the component terminals as illustrated in FIG. 23C. In addition, the operator command input device 110 designates the component terminal B and the global route adjacent to the component terminal B in a right-hand side. Thereafter, the routing (wiring) renewer 119 makes the global route in the component terminal side go round the component terminal B as illustrated in FIG. 23D.

Now, the description will proceed to main merits in the graphic layout compaction system according to the fifth embodiment of the present invention.

The graphic layout compaction system according to the fifth embodiment can break a part of the layout as a broken area and can place or arrange the broken area with the broken area moved or rotated freely. In addition, the graphic layout compaction system according to the fifth embodiment can carry out compaction placement or arrangement by modifying the terminal graph data 80 as to make the global route go round the component terminal.

While this invention has thus far been described in conjunction with a few preferred embodiments thereof, it will now be readily possible for those skilled in the art to put this invention into various other manners. For example, the program realizing each unit in the above-mentioned computers 100, 100A, 100B, and 100C may be recorded in a recording medium 120 as shown in a block enclosed with a broken line in FIGS. 3, 12, 15, and 19. Herein, the "recording medium" means a recording medium for recording the program which enables each of the computers 100, 100A, 100B, and 100C to read. For example, the recording medium 120 may be a compact disc read-only memory (CD-ROM), a magnetic disk such as a floppy or flexible disk, a semiconductor memory, or the like. The recording medium 120 may be a magnetic tape, a paper tape, or even a paper recording the program. In case where the recording medium 120 is a paper, the computer further comprises a reading device such as an OCR (optical character reader) and a compiler for converting characters (codes) read by the reading device into a machine language recognizable by the computer. At any rate, such a program is installed from the recording medium 120 in each of the computers 100, 100A, 100B, and 100C.

What is claimed is:

1. A graphic layout compaction system for compacting a layout where components and routes are placed on a two-dimensional space, said graphic layout compaction system comprising:

calculating means for calculating a movement limit area within which a first component can move in any directions towards a second component in consideration of a route bandwidth interposed therebetween, the route bandwidth being obtained by adding a necessary space to a width of particular routes put between the first component and the second component;

component compacting means for moving the first component on a position where the first component is not interfered with the movement limit area; and rerouting means for shaping the particular routes into shaped particular routes having configurations including oblique parts to reroute the shaped particular routes in a space between the first and the second components.

2. A graphic layout compaction system as claimed in claim 1, wherein said component compacting means shifts a movement direction for the first component from longitudinal and lateral directions.

3. A graphic layout compaction system as claimed in claim 1, wherein said calculating means comprises:
    means for subtracting widths of the first and the second components in a quantization direction from a length where a vector connecting the first and the second components is projected in the quantization direction to produce a subtracted distance, the quantization direction being obtained by quantizing the any directions by a predetermined angle;
    means for calculating a polygonal configuration having a width in the quantization direction that is obtained by subtracting the route bandwidth from the subtracting distance; and
    means for obtaining an area inside the polygonal configuration as the movement limit area.

4. A graphic layout compaction system as claimed in claim 3, wherein the predetermined angle is equal to 45°.

5. A graphic layout compaction system as claimed in claim 1, wherein said calculating means comprises:
    means for adding a width of the first component in a quantization direction and a width of the second component in the opposite direction of the quantization direction to produce an added distance, the quantization direction being obtained by quantizing the any direction by a predetermined angle;
    means for calculating a polygonal configuration having a width in the quantization direction that is obtained by adding the route bandwidth to the added distance; and
    means for obtaining an area outside the polygonal configuration as the movement limit area.

6. A graphic layout compaction system as claimed in claim 5, wherein the predetermined angle is equal to 45°.

7. A graphic layout compaction system as claimed in claim 1, wherein said graphic layout compaction system further comprises:
    a display unit for displaying said components thereon;
    operator command input means for receiving a command from an operator; and
    component movement designating means for freely designating movement target positions for the components in response to the commands from said operator command input means,
    said component compacting means moving the components on the respective movement target positions, and said rerouting means fixing the routes.

8. A graphic layout compaction system as claimed in claim 7, wherein further comprises means for making said display unit display a shortest route network graph.

9. A graphic layout compaction system as claimed in claim 7, wherein said component movement designating means receives particular commands for inserting additional routes and additional components, and said component compacting means carrying out component movement so as to maintain spaces between the components in consideration of the additional routes and the additional components.

10. A graphic layout compaction system as claimed in claim 1, wherein said graphic layout compaction system further comprises:
    a display unit for displaying said components thereon; and
    component movement designating means for designating movement directions and movement distances for the components, individually,
    said component compacting means moving the components in accordance with the movement directions and the movement distances.

11. A graphic layout compaction system as claimed in claim 10, wherein said component compacting means comprises:
    means for enlarging distances between the components and a layout center into similar distances;
    means for automatically routing between terminals of each component; and
    means for compacting the components and the routes toward the layout center.

12. A graphic layout compaction system as claimed in claim 1, wherein said graphic layout compaction system further comprises:
    a display unit for displaying said components thereon; and
    component movement designating means for collectively designating a movement direction and a movement distance for the components toward a direction turning to a predetermined layout position,
    said component compacting means moving the components in accordance with the movement direction and the movement distance.

13. A graphic layout compaction system as claimed in claim 12, wherein said component compacting means comprises:
    means for enlarging distances between the components and a layout center into similar distances;
    means for automatically routing between terminals of each component; and
    means for compacting the components and the routes toward the layout center.

14. A graphic layout compaction system as claimed in claim 1, wherein said graphic layout compaction system further comprises:
    a display unit for displaying said components thereon; and
    component movement designating means for collectively designating a movement direction and a movement distance for the components toward a direction apart from a predetermined layout position,
    said component compacting means moving the components in accordance with the movement direction and the movement distance.

15. A graphic layout compaction system as claimed in claim 14, wherein said component compacting means comprises:
    means for enlarging distances between the components and a layout center into similar distances;
    means for automatically routing between terminals of each component; and
    means for compacting the components and the routes toward the layout center.

16. A graphic layout compaction system as claimed in claim 1, wherein said graphic layout compaction system further comprises:
    component set expanding means for cutting off a partial area of the layout to replace the partial area by parallel movement and rotation; and
    renewing means for renewing connections between component terminals inside the partial area and component terminals outside the partial area.

17. A graphic layout compaction system as claimed in claim 1, wherein said graphic layout compaction system further comprises routing renewing means for switching the order of first and second routes with each other.

18. A graphic layout compaction system for compacting a layout where components and routes are placed on a two-dimensional space, said graphic layout compaction system comprising:

a calculator for calculating a movement limit area within which a first component can move in any directions towards a second component in consideration of a route bandwidth interposed therebetween, the route bandwidth being obtained by adding a necessary space to a width of particular routes put between the first component and the second component;

component compactor for moving the first component on a position where the first component is not interfered with the movement limit area; and rerouting unit for shaping the particular routes into shaped particular routes having configurations including oblique parts to reroute the shaped particular routes in a space between the first and the second components.

19. A graphic layout compaction system as claimed in claim 18, wherein said component compacting means shifts a movement direction for the first component from longitudinal and lateral directions.

20. A graphic layout compaction system as claimed in claim 18, wherein said calculator comprises:

a unit for subtracting widths of the first and the second components in a quantization direction from a length where a vector connecting the first and the second components is projected in the quantization direction to produce a subtracted distance, the quantization direction being obtained by quantizing the any directions by a predetermined angle;

a unit for calculating a polygonal configuration having a width in the quantization direction that is obtained by subtracting the route bandwidth from the subtracting distance; and a unit for obtaining an area inside the polygonal configuration as the movement limit area.

21. A graphic layout compaction system as claimed in claim 20, wherein the predetermined angle is equal to 45°.

22. A graphic layout compaction system as claimed in claim 18, wherein said calculator comprises:

a unit for adding a width of the first component in a quantization direction and a width of the second component in the opposite direction of the quantization direction to produce an added distance, the quantization direction being obtained by quantizing the any direction by a predetermined angle;

a unit for calculating a polygonal configuration having a width in the quantization direction that is obtained by adding the route bandwidth to the added distance; and a unit for obtaining an area outside the polygonal configuration as the movement limit area.

23. A graphic layout compaction system as claimed in claim 22, wherein the predetermined angle is equal to 45°.

24. A graphic layout compaction system as claimed in claim 18, wherein said graphic layout compaction system further comprises:

a display unit for displaying said components thereon;

an operator command input device for receiving a command from an operator; and a component movement designator for freely designating movement target positions for the components in response to the commands from said operator command input means, said component compactor moving the components on the respective movement target positions, and said rerouting unit fixing the routes.

25. A graphic layout compaction system as claimed in claim 24, wherein further comprises a unit for making said display unit display a shortest route network graph.

26. A graphic layout compaction system as claimed in claim 24, wherein said component movement designator receives particular commands for inserting additional routes and additional components, and said component compactor carrying out component movement so as to maintain spaces between the components in consideration of the additional routes and the additional components.

27. A graphic layout compaction system as claimed in claim 18, wherein said graphic layout compaction system further comprises:

a display unit for displaying said components thereon; and a component movement designator for designating movement directions and movement distances for the components, individually, said component compactor moving the components in accordance with the movement directions and the movement distances.

28. A graphic layout compaction system as claimed in claim 27, wherein said component compactor comprises:

a unit for enlarging distances between the components and a layout center into similar distances;

a unit for automatically routing between terminals of each component; and a unit for compacting the components and the routes toward the layout center.

29. A graphic layout compaction system as claimed in claim 18, wherein said graphic layout compaction system further comprises:

a display unit for displaying said components thereon; and a component movement designator for collectively designating a movement direction and a movement distance for the components toward a direction turning to a predetermined layout position, said component compactor moving the components in accordance with the movement direction and the movement distance.

30. A graphic layout compaction system as claimed in claim 29, wherein said component compactor comprises:

a unit for enlarging distances between the components and a layout center into similar distances;

a unit for automatically routing between terminals of each component; and a unit for compacting the components and the routes toward the layout center.

31. A graphic layout compaction system as claimed in claim 18, wherein said graphic layout compaction system further comprises:

a display unit for displaying said components thereon; and a component movement designator for collectively designating a movement direction and a movement distance for the components toward a direction apart from a predetermined layout position, said component compactor moving the components in accordance with the movement direction and the movement distance.

32. A graphic layout compaction system as claimed in claim 31, wherein said component compactor comprises:

a unit for enlarging distances between the components and a layout center into similar distances;

a unit for automatically routing between terminals of each component; and a unit for compacting the components and the routes toward the layout center.

33. A graphic layout compaction system as claimed in claim 18, wherein said graphic layout compaction system further comprises:

a component set expander for cutting off a partial area of the layout to replace the partial area by parallel movement and rotation; and a renewer for renewing connections between component terminals inside the partial area and component terminals outside the partial area.

34. A graphic layout compaction system as claimed in claim 18, wherein said graphic layout compaction system further comprises a routing renewer for switching the order of first and second routes with each other.

35. A method of compacting a layout where components and routes are placed on a two-dimensional space, said method comprising the steps of:

calculating a movement limit area within which a first component can move in any directions towards a second component in consideration of a route bandwidth interposed therebetween, the route bandwidth being obtained by adding a necessary space to a width of particular routes put between the first component and the second component;

compacting said components by moving the first component on a position where the first component is not interfered with the movement limit area; and shaping the particular routes into shaped particular routes having configurations including oblique parts to reroute the shaped particular routes in a space between the first and the second components.

36. A method as claimed in claim 35, wherein said step of compacting said components shifts a movement direction for the first component from longitudinal and lateral directions.

37. A method as claimed in claim 35, wherein said step of calculating the movement limit area comprises the substeps of:

subtracting widths of the first and the second components in a quantization direction from a length where a vector connecting the first and the second components is projected in the quantization direction to produce a subtracted distance, the quantization direction being obtained by quantizing the any directions by a predetermined angle;

calculating a polygonal configuration having a width in the quantization direction that is obtained by subtracting the route bandwidth from the subtracting distance; and obtaining an area inside the polygonal configuration as the movement limit area.

38. A method as claimed in claim 37, wherein the predetermined angle is equal to 45°.

39. A method as claimed in claim 35, wherein said step of calculating the movement limit area comprises the substeps of:

adding a width of the first component in a quantization direction and a width of the second component in the opposite direction of the quantization direction to produce an added distance, the quantization direction being obtained by quantizing the any directions by a predetermined angle;

calculating a polygonal configuration having a width in the quantization direction that is obtained by adding the route bandwidth to the added distance; and obtaining an area outside the polygonal configuration as the movement limit area.

40. A method as claimed in claim 39, wherein the predetermined angle is equal to 45°.

41. A method as claimed in claim 35, wherein said method further comprises the steps of:

displaying said components on a display unit;

receiving commands from an operator; and freely designating movement target positions for the components in response to the commands, said step of compacting the components moving the components on the respective movement target positions, and said step of rerouting fixing the routes.

42. A method as claimed in claim 41, wherein said step of compacting the components displaying a shortest route network graph on said display unit.

43. A method as claimed in claim 41, wherein said step of designating the component movement receives particular commands for inserting additional routes and additional components, and said step of compacting said components carrying out component movement so as to maintain spaces between the components in consideration of the additional routes and the additional components.

44. A method as claimed in claim 35, wherein said method further comprises the steps of:

displaying said components on a display unit; and designating movement directions and movement distances for the components, individually, said step of compacting the components moving the components in accordance with the movement directions and the movement distances.

45. A method as claimed in claim 44, wherein said step of compacting the components comprises the substeps of:

enlarging distances between the components and a layout center into similar distances;

automatically routing between terminals of each components; and compacting the components and the routes toward the layout center.

46. A method as claimed in claim 35, wherein said method further comprises the steps of:

displaying said components on a display unit; and collectively designating a movement direction and a movement distance for the components toward a direction turning to a predetermined layer position, said step of compacting the components moving the components in accordance with the movement direction and the movement distance.

47. A method as claimed in claim 46, wherein said step of compacting the components comprises the substeps of:

enlarging distances between the components and a layout center into similar distances;

automatically routing between terminals of each components; and compacting the components and the routes toward the layout center.

48. A method as claimed in claim 35, wherein said method further comprises the steps of:

displaying said components on a display unit; and collectively designating a movement direction and a movement distance for the components toward a direction apart from a predetermined layer position, said step of compacting the components moving the components in accordance with the movement direction and the movement distance.

49. A method as claimed in claim 48, wherein said step of compacting the components comprises the substeps of:

enlarging distances between the components and a layout center into similar distances;

automatically routing between terminals of each components; and compacting the components and the routes toward the layout center.

50. A method as claimed in claim 35, wherein said method further comprises the steps of:
    cutting off a partial area of the layout to replace the partial area by parallel movement and rotation; and
    renewing connections between component terminals inside the partial area and component terminals outside the partial area.

51. A method as claimed in claim 35, wherein said method further comprises the step of switching the order of first and second routes with each other.

52. A recording medium for recording a program to make a computer execute processing for compacting a layout where components and routes are placed on a two-dimensional space, said recording medium recording the program to make said computer execute:
    a first processing of calculating a movement limit area within which a first component can move in any directions towards a second component in consideration of a route bandwidth interposed therebetween, the route bandwidth being obtained by adding a necessary space to a width of particular routes put between the first component and the second component;
    a second processing of compacting said components by moving the first component on a position where the first component is not interfered with the movement limit area; and
    a third processing of shaping the particular routes into shaped particular routes having configurations including oblique parts to reroute the shaped particular routes in a space between the first and the second components.

53. A recording medium as claimed in claim 52, wherein said second processing is processing of moving the first component on the position by shifting a movement direction of the first component from longitudinal and lateral directions.

54. A recording medium as claimed in claim 52, wherein said first processing comprises the subprocessings of:
    subtracting widths of the first and the second components in a quantization direction from a length where a vector connecting the first and the second components is projected in the quantization direction to produce a subtracted distance, the quantization direction being obtained by quantizing the any direction by a predetermined angle;
    calculating a polygonal configuration having a width in the quantization direction that is obtained by subtracting the route bandwidth from the subtracting distance; and
    obtaining an area inside the polygonal configuration as the movement limit area.

55. A recording medium as claimed in claim 54, wherein the predetermined angle is equal to 45°.

56. A recording medium as claimed in claim 52, wherein said first processing comprises the subprocessings of:
    adding a width of the first component in a quantization direction and a width of the second component in the opposite direction of the quantization direction to produce an added distance, the quantization direction being obtained by quantizing the any direction by a predetermined angle;
    calculating a polygonal configuration having a width in the quantization direction that is obtained by adding the route bandwidth to the added distance; and
    obtaining an area outside the polygonal configuration as the movement limit area.

57. A recording medium as claimed in claim 56, wherein the predetermined angle is equal to 45°.

58. A recording medium as claimed in claim 52, wherein said recording medium further makes the computer execute:
    a fourth processing of displaying said components on a display unit;
    a fifth processing of receiving commands from an operator; and
    a sixth processing of freely designating movement target positions for the components in response to the commands,
    said second processing including a subprocessing of moving the components on the respective movement target positions, and said third processing including a subprocessing of rerouting fixing the routes.

59. A recording medium as claimed in claim 58, wherein said recording medium further makes the computer execute a seventh processing of displaying a shortest route network graph on said display unit.

60. A recording medium as claimed in claim 58, wherein said sixth processing includes a subprocessing of receiving particular commands for inserting additional routes and additional components, and said second processing including a subprocessing of carrying out component movement so as to maintain spaces between the components in consideration of the additional routes and the additional components.

61. A recording medium as claimed in claim 52, wherein said recording medium further makes the computer execute:
    a fourth processing of displaying said components on a display unit; and
    a fifth processing of designating movement directions and movement distances for the components, individually,
    said second processing including a subprocessing of moving the components in accordance with the movement directions and the movement distances.

62. A recording medium as claimed in claim 61, wherein said second processing includes the subprocessings of:
    enlarging distance between the components and a layout center into similar distances;
    automatically routing between terminals of each component; and
    compacting the components and the routes toward the layout center.

63. A recording medium as claimed in claim 52, wherein said recording medium further makes the computer execute:
    a fourth processing of displaying said components on a display unit; and
    a fifth processing of collectively designating a movement direction and a movement distance for the components toward a direction turning to a predetermined layout positions,
    said second processing including a subprocessing of moving the components in accordance with the movement direction and the movement distance.

64. A recording medium as claimed in claim 63, wherein said second processing includes the subprocessings of:
    enlarging distance between the components and a layout center into similar distances;
    automatically routing between terminals of each component; and
    compacting the components and the routes toward the layout center.

65. A recording medium as claimed in claim 52, wherein said recording medium further makes the computer execute:
- a fourth processing of displaying said components on a display unit; and
- a fifth processing of collectively designating a movement direction and a movement distance for the components toward a direction apart from a predetermined layout positions,
- said second processing including a subprocessing of moving the components in accordance with the movement direction and the movement distance.

66. A recording medium as claimed in claim 65, wherein said second processing includes the subprocessings of:
- enlarging distance between the components and a layout center into similar distances;
- automatically routing between terminals of each component; and
- compacting the components and the routes toward the layout center.

67. A recording medium as claimed in claim 52, wherein said recording medium further makes the computer execute:
- a fourth processing of cutting off a partial area of the layout to replace the partial area by parallel movement and rotation; and
- a fifth processing of renewing connections between component terminals inside the partial area and component terminals outside the partial area.

68. A recording medium as claimed in claim 52, wherein said recording medium further makes the computer execute a processing of switching the order of first and second routes with each other.

* * * * *